(12) United States Patent  
Kanazawa et al.

(10) Patent No.: US 7,671,468 B2
(45) Date of Patent: Mar. 2, 2010

(54) LIGHT EMITTING APPARATUS

(75) Inventors: Jitsuo Kanazawa, Tokyo (JP); Yo Saito, Tokyo (JP); Kimio Suto, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/515,195

(22) Filed: Sep. 5, 2006

(65) Prior Publication Data

US 2007/0075323 A1 Apr. 5, 2007

(30) Foreign Application Priority Data

Sep. 30, 2005 (JP) ............................. 2005-288989
Nov. 24, 2005 (JP) ............................. 2005-339183

(51) Int. Cl.
*H01L 27/15* (2006.01)
(52) U.S. Cl. .................. 257/724; 257/99; 257/E33.068
(58) Field of Classification Search .......... 257/E33.068, 257/99, 724
See application file for complete search history.

(56) References Cited

U.S. PATENT DOCUMENTS

| | | | | |
|---|---|---|---|---|
| 6,445,011 | B1 * | 9/2002 | Hirano et al. .................. | 257/99 |
| 6,579,427 | B1 * | 6/2003 | Arbab et al. ............ | 204/192.27 |
| 7,279,724 | B2 * | 10/2007 | Collins et al. ................ | 257/103 |
| 2005/0104220 | A1 * | 5/2005 | Tsuchiya et al. ............. | 257/774 |
| 2005/0133796 | A1 * | 6/2005 | Seo et al. ........................ | 257/79 |

FOREIGN PATENT DOCUMENTS

| | | |
|---|---|---|
| JP | A-11-251644 | 9/1999 |
| JP | A-11-289110 | 10/1999 |
| JP | A 2001-15815 | 1/2001 |
| JP | A-2001-307910 | 11/2001 |
| JP | A-2003-142736 | 5/2003 |
| JP | A-2004-055632 | 2/2004 |

* cited by examiner

*Primary Examiner*—Lynne A. Gurley
*Assistant Examiner*—Colleen A Matthews
(74) *Attorney, Agent, or Firm*—Oliff & Berridge, PLC

(57) ABSTRACT

A light emitting apparatus is comprised of a multilayer chip varistor having a varistor element body, a semiconductor light emitting element, and a reflecting portion. The varistor element body includes a varistor layer, and a plurality of internal electrodes opposed to each other so as to interpose the varistor layer between the internal electrodes. The semiconductor light emitting element is disposed on the multilayer chip varistor and is electrically connected to the plurality of internal electrodes so as to be connected in parallel to the multilayer chip varistor. The reflecting portion is disposed between the multilayer chip varistor and the semiconductor light emitting element. The reflecting portion reflects light traveling toward the multilayer chip varistor out of light generated by the semiconductor light emitting element.

15 Claims, 17 Drawing Sheets

Fig.9
(a)
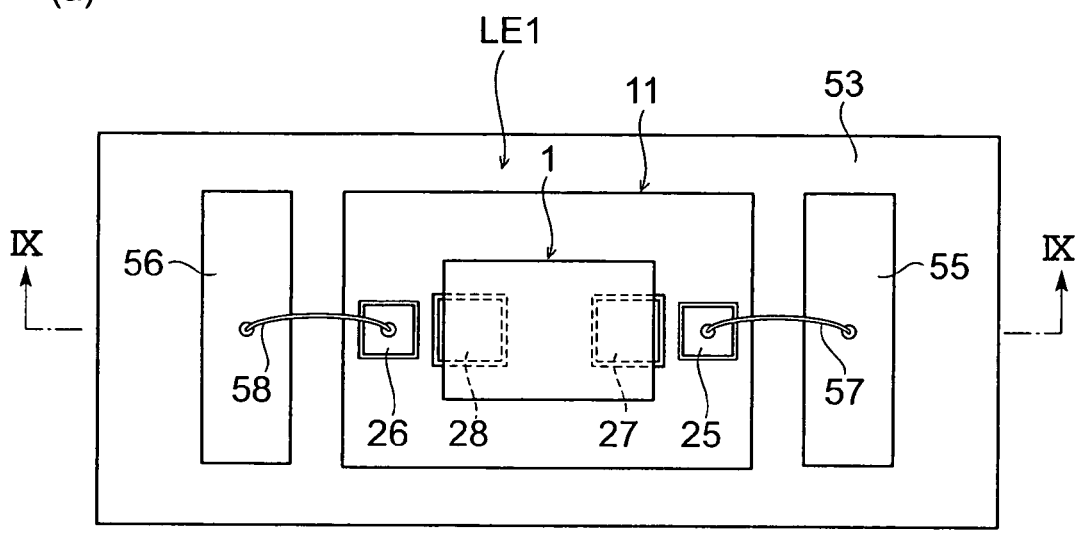
(b)
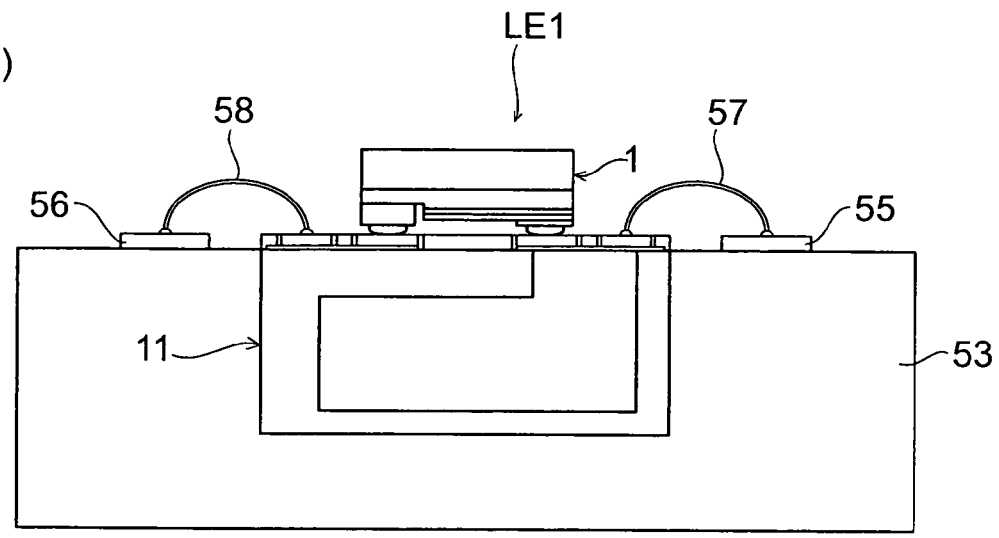

LIGHT EMITTING APPARATUS

BACKGROUND OF THE INVENTION

1. Field of the Invention

The present invention relates to light emitting apparatus having a semiconductor light emitting element and a multilayer chip varistor.

2. Related Background Art

The conventionally known light emitting apparatus includes one having a semiconductor light emitting element, and a varistor connected in parallel to the semiconductor light emitting element (e.g., cf. Japanese Patent Application Laid-Open No. 2001-15815). In the light emitting apparatus described in Japanese Patent Application Laid-Open No. 2001-15815, a light reflecting plate is located around the semiconductor light emitting element.

SUMMARY OF THE INVENTION

The light emitting apparatus described in the Laid-Open No. 2001-15815 is required to secure a space for arrangement of the light reflecting plate around the semiconductor light emitting element. For this reason, it is difficult to achieve downsizing of the whole light emitting apparatus. However, if the light reflecting plate is excluded for downsizing, luminous efficiency will degrade.

An object of the present invention is therefore to provide a light emitting apparatus achieving a high luminous efficiency and enabling downsizing.

A light emitting apparatus according to the present invention is a light emitting apparatus comprising: a multilayer chip varistor having a laminate body comprising a varistor layer, and a plurality of internal electrodes arranged so as to interpose the varistor layer between the internal electrodes, and a plurality of external electrodes formed on an outer surface of the laminate body and connected each to corresponding internal electrodes out of the plurality of internal electrodes; a semiconductor light emitting element disposed on the multilayer chip varistor and connected to the plurality of external electrodes so as to be connected in parallel to the multilayer chip varistor; and a reflecting layer disposed between the multilayer chip varistor and the semiconductor light emitting element and adapted to reflect light generated by the semiconductor light emitting element.

In the light emitting apparatus according to the present invention, the reflecting layer is disposed between the multilayer chip varistor and the semiconductor light emitting element, whereby the reflecting layer can reflect light traveling toward the multilayer chip varistor, out of the light generated by the semiconductor light emitting element. Therefore, the apparatus is able to achieve a high luminous efficiency. As the reflecting layer is located between the multilayer chip varistor and the semiconductor light emitting element, there is no need for securing an extra space around the semiconductor light emitting element. Therefore, it becomes feasible to achieve downsizing of the whole light emitting apparatus.

Preferably, the reflecting layer contains a glass and a metal. In this case, the reflecting layer is a layer in which the metal is dispersed in the glass. Since the reflecting layer contains the glass, the reflecting layer can be obtained as one without electrical conductivity. Therefore, a short circuit can be prevented between the external electrodes of the multilayer chip varistor. When the reflecting layer contains the glass, the reflecting layer can be one with excellent heat resistance. Since the reflecting layer contains the metal, it can securely reflect the light generated by the semiconductor light emitting element. As the reflecting layer contains the metal, it has a good thermal conductivity and thus can efficiently dissipate heat from the semiconductor light emitting element.

Preferably, the reflecting layer contains a resin and a metal. In this case, the reflecting layer is a layer in which the metal is dispersed in the resin. Since the reflecting layer contains the resin, the reflecting layer has electric insulation. Therefore, a short circuit can be prevented between the external electrodes of the multilayer chip varistor. When the reflecting layer contains the resin, it becomes easier to form the reflecting layer and it is feasible to achieve good adhesion between the multilayer chip varistor or the semiconductor light emitting element and the reflecting layer. Furthermore, since the reflecting layer contains the metal, it can securely reflect the light generated by the semiconductor light emitting element. As the reflecting layer contains the metal, it has a good thermal conductivity and thus can efficiently dissipate heat from the semiconductor light emitting element.

Preferably, the reflecting layer contains a glass and a metal oxide. In this case, since the reflecting layer contains the glass, the reflecting layer can be obtained as one without electrical conductivity and with sufficient heat resistance. Since the reflecting layer contains the metal oxide, it can securely reflect the light generated by the semiconductor light emitting element and the electric insulation of the reflecting layer can be further enhanced. Since the metal oxide has good dispersibility in glass, it is easy to form the reflecting layer in which the metal oxide is uniformly dispersed and which has little characteristic variation. Since the reflecting layer contains the glass and metal oxide, the reflecting layer can be one with a relatively small coefficient of thermal expansion. As a result, the reflecting layer can be prevented from being distorted or broken or from cracking.

Preferably, the reflecting layer contains s resin and s metal oxide. In this case, since the reflecting layer contains the resin, the reflecting layer has electric insulation. When the reflecting layer contains the resin, it becomes easy to form the reflecting layer and it is feasible to achieve good adhesion between the multilayer chip varistor or the semiconductor light emitting element and the reflecting layer. Furthermore, since the reflecting layer contains the metal oxide, the reflecting layer can securely reflect the light generated by the semiconductor light emitting element and the electric insulation of the reflecting layer can be further enhanced.

Preferably, the reflecting layer contains a glass and a powder consisting of a metal, and the powder consisting of the metal is coated with a metal oxide. In this case, since the reflecting layer contains the glass, the reflecting layer can be obtained as one without electrical conductivity and with sufficient heat resistance. Since the powder consisting of the metal is coated with the metal oxide, it is feasible to improve the dispersibility of the powder consisting of the metal in the glass and to further enhance the electric insulation of the reflecting layer without reduction in reflection efficiency.

Preferably, the reflecting layer contains a resin and a powder consisting of a metal, and the powder consisting of the metal is coated with a metal oxide. In this case, since the reflecting layer contains the resin, the reflecting layer can be obtained as one without electrical conductivity and with easiness of formation and good adhesion. By using the metal powder coated with the metal oxide, it becomes feasible to enhance the dispersibility of the powder consisting of the metal in the resin and to further enhance the electric insulation of the reflecting layer without reduction in reflection efficiency.

Preferably, the reflecting layer has a thin film layer consisting of a metal. In this case, the metal can securely reflect the light generated by the semiconductor light emitting element. Since the thin film layer is used, the thickness of the reflecting layer can be made smaller. As a result, the light emitting apparatus can be more downsized.

The reflecting layer preferably contains at least one of Ag, Al, Ti, and Ni as the metal. Since Ag, Al, Ti, and Ni have the reflectance higher than those of the other common metals, they can increase the reflection efficiency of the reflecting layer. Therefore, the luminous efficiency of the light emitting apparatus can be further enhanced.

The reflecting layer preferably contains at least one of silicone resin, polytetrafluoroethylene, polyethylene terephthalate, and xylene resin as the resin. When these materials are used, the reflecting layer with high electric insulation can be obtained with certainty. It is also feasible to securely enhance easiness of formation of the reflecting layer and adhesion between the multilayer chip varistor or the semiconductor light emitting element and the reflecting layer.

The reflecting layer preferably contains at least one of $Al_2O_3$, $TiO_2$, $SiO_2$, and $ZrO_2$ as the metal oxide. Since $Al_2O_3$, $TiO_2$, $SiO_2$, and $ZrO_2$ have the reflectance higher than those of the other common metal oxides, they can further enhance the reflection efficiency of the reflecting layer.

Preferably, the reflecting layer is formed on a surface of the multilayer chip varistor opposing the semiconductor light emitting element. In this case, the reflecting layer and the multilayer chip varistor can be formed together. Preferably, the reflecting layer is formed on a surface of the semiconductor light emitting element opposing the multilayer chip varistor. In this case, the reflecting layer and the semiconductor light emitting element can be formed together. When the apparatus is constructed using the multilayer chip varistor or the semiconductor light emitting element and the reflecting layer formed together as described above, it becomes easier to assemble the light emitting apparatus.

Preferably, the semiconductor light emitting element is flip-chip bonded or wire bonded onto the multilayer chip varistor. In this case, the semiconductor light emitting element can be placed on the multilayer chip varistor, without need for provision of a support member for supporting the semiconductor light emitting element. Therefore, the entire light emitting apparatus can be further downsized.

Another light emitting apparatus according to the present invention is a light emitting apparatus comprising: a multilayer chip varistor having a varistor element body comprising a varistor layer and a plurality of internal electrodes opposed to each other so as to interpose the varistor layer between the internal electrodes; a semiconductor light emitting element disposed on the multilayer chip varistor and electrically connected to the plurality of internal electrodes so as to be connected in parallel to the multilayer chip varistor; and a reflecting portion disposed between the multilayer chip varistor and the semiconductor light emitting element and adapted to reflect light generated by the semiconductor light emitting element; wherein the reflecting portion has: a first reflecting layer for diffusely reflecting incident light; and a second reflecting layer disposed between the first reflecting layer and the multilayer chip varistor and adapted to specularly reflect incident light.

In the light emitting apparatus according to the present invention, the reflecting portion is disposed between the multilayer chip varistor and the semiconductor light emitting element, and thus the reflecting portion reflects light traveling toward the multilayer chip varistor out of the light generated by the semiconductor light emitting element. At this time, since the reflecting portion has the first reflecting layer and the second reflecting layer, the light traveling from the semiconductor light emitting element toward the multilayer chip varistor is incident to the first reflecting layer and is diffusely reflected. Then the light transmitted by the first reflecting layer is specularly reflected by the second reflecting layer. Therefore, as the reflecting portion has the first reflecting layer and the second reflecting layer, an extremely high luminous efficiency can be achieved. Since the reflecting portion is located between the multilayer chip varistor and the semiconductor light emitting element, there is no need for securing an extra space around the semiconductor light emitting element. Therefore, the entire light emitting apparatus can be downsized.

Preferably, the first reflecting layer is a glass layer in which a metal is dispersed. In this case, the first reflecting layer has electric insulation and can suppress occurrence of a short circuit in the multilayer chip varistor. Since the first reflecting layer is the glass layer, the first reflecting layer can be one with excellent heat resistance. Since the metal is dispersed in the glass layer, incident light can be diffusely reflected with certainty. Since the metal is dispersed in the glass layer, the first reflecting layer has a relatively good thermal conductivity and can efficiently dissipate heat from the semiconductor light emitting element.

Preferably, the first reflecting layer is a glass layer in which a metal oxide is dispersed. In this case, the first reflecting layer has electric insulation and can suppress occurrence of a short circuit in the multilayer chip varistor. Since the first reflecting layer is the glass layer, the first reflecting layer can be one with excellent heat resistance. Since the metal oxide is dispersed in the glass layer, incident light can be diffusely reflected with certainty and the electric insulation of the first reflecting layer can be further enhanced. Since the metal oxide has good dispersibility in glass, the metal oxide is uniformly dispersed and the first reflecting layer has little characteristic variation. When the first reflecting layer contains the glass and metal oxide, the coefficient of thermal expansion is relatively small. For this reason, the first reflecting layer can be prevented from being distorted or broken or from cracking.

Preferably, the first reflecting layer is a glass layer in which a metal coated with a metal oxide is dispersed. In this case, the first reflecting layer has electric insulation and can suppress occurrence of a short circuit in the multilayer chip varistor. Since the first reflecting layer is the glass layer, the first reflecting layer can be one with excellent heat resistance. Since the metal is coated with the metal oxide, it is feasible to enhance the dispersibility of the metal in glass and to further enhance the electric insulation of the first reflecting layer without reduction in reflection efficiency.

The metal is preferably at least one metal selected from the group consisting of Ag, Al, Ti, and Ni. Since Ag, Al, Ti, and Ni have the reflectance higher than those of the other common metals, they can increase the reflection efficiency of the first reflecting layer. Therefore, the luminous efficiency of the light emitting apparatus can be further increased.

The metal oxide is preferably at least one metal oxide selected from the group consisting of $Al_2O_3$, $TiO_2$, $SiO_2$, and $ZrO_2$. Since $Al_2O_3$, $TiO_2$, $SiO_2$, and $ZrO_2$ have the reflectance higher than those of the other common metal oxides, they can further enhance the reflection efficiency of the first reflecting layer.

Preferably, the second reflecting layer is a metal layer. In this case, the second reflecting layer can specularly reflect the light transmitted by the first reflecting layer, with certainty.

The metal layer is preferably comprised of at least one metal selected from the group consisting of Ag, Al, Ti, and Ni. Since Ag, Al, Ti, and Ni have the reflectance higher than those of the other common metals, they can enhance the reflection efficiency of the second reflecting layer. Therefore, the luminous efficiency of the light emitting apparatus can be further increased.

Incidentally, the Inventor et al. conducted research study and found the following new fact about the thermal conductivity of the varistor element body having the varistor layer and a plurality of internal electrodes opposed to each other so as to interpose the varistor layer between them. In the foregoing varistor element body, the thermal conductivity in the direction perpendicular to the opposing direction of the internal electrodes is larger than the thermal conductivity in the opposing direction. This is presumably because each internal electrode extends in the direction perpendicular to the opposing direction of the internal electrodes, and heat is likely to transmit in the direction parallel to the internal electrodes. Therefore, the outer surfaces extending in the direction parallel to the opposing direction of the internal electrodes out of the outer surfaces of the varistor element body dissipate more heat than the outer surfaces extending in the direction intersecting with the opposing direction of the internal electrodes out of the outer surfaces of the varistor element body.

In light of the above fact, preferably, the second reflecting layer is formed on one outer surface extending in the direction parallel to the opposing direction of the plurality of internal electrodes out of the outer surfaces of the varistor element body, and the first reflecting layer is formed on the second reflecting layer so as to cover the second reflecting layer. In this case, heat generated in the semiconductor light emitting element can be efficiently transmitted to the varistor element body to be dissipated. As a result, it is feasible to suppress degradation of characteristics of the semiconductor light emitting element.

Preferably, the second reflecting layer consists of a plurality of metal layers electrically insolated from each other, and the plurality of metal layers are connected each to corresponding internal electrodes out of the plurality of internal electrodes and connected each to a plurality of pad electrodes formed on the first reflecting layer through conductors provided so as to penetrate the first reflecting layer. In this case, the second reflecting layer forms part of electric current paths between the multilayer chip varistor and the semiconductor light emitting element. As a result, even in the configuration wherein the reflecting portion is disposed between the multilayer chip varistor and the semiconductor light emitting element, secure electric connection between the multilayer chip varistor and the semiconductor light emitting element can be implemented by the extremely simple configuration.

Preferably, the semiconductor light emitting element is connected to the plurality of pad electrodes.

The present invention successfully provides the light emitting apparatus having a high luminous efficiency and enabling downsizing.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 9 is a drawing showing a mounted state of the light emitting apparatus of the first embodiment.

DESCRIPTION OF THE PREFERRED EMBODIMENTS

The preferred embodiments of the present invention will be described below in detail with reference to the accompanying drawings. In the description the same elements or elements with the same functionality will be denoted by the same reference symbols, without redundant description.

First Embodiment

Figure 1:
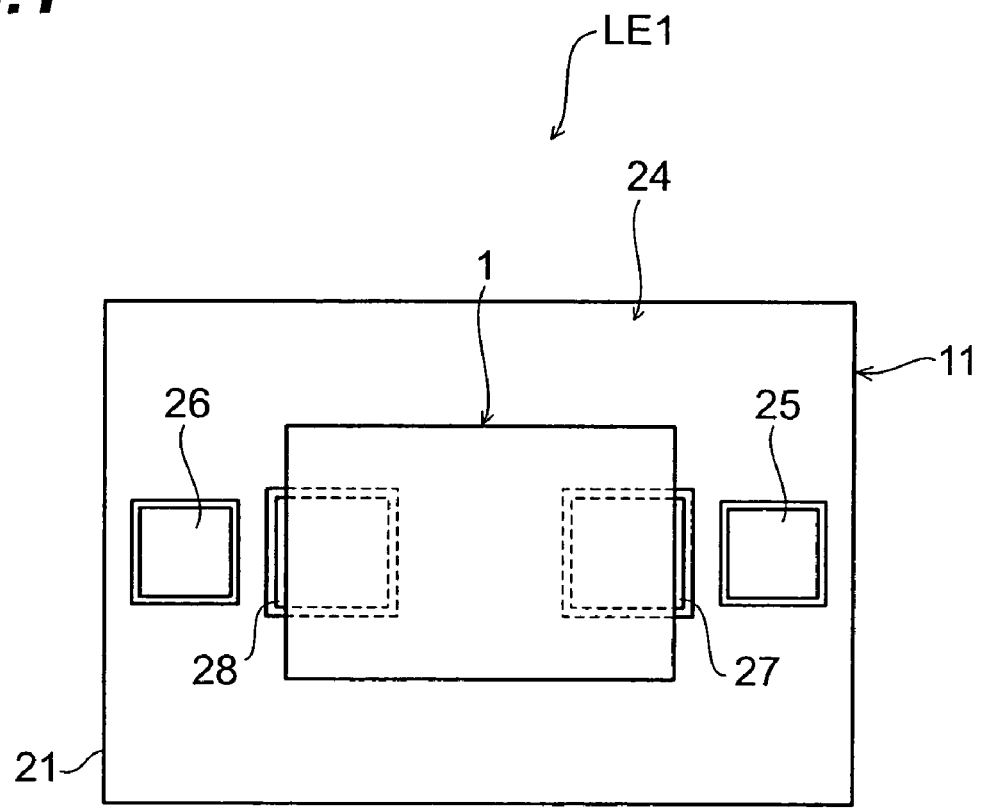
FIG. 1 is a schematic top view showing a light emitting apparatus according to the first embodiment.
Figure 2:
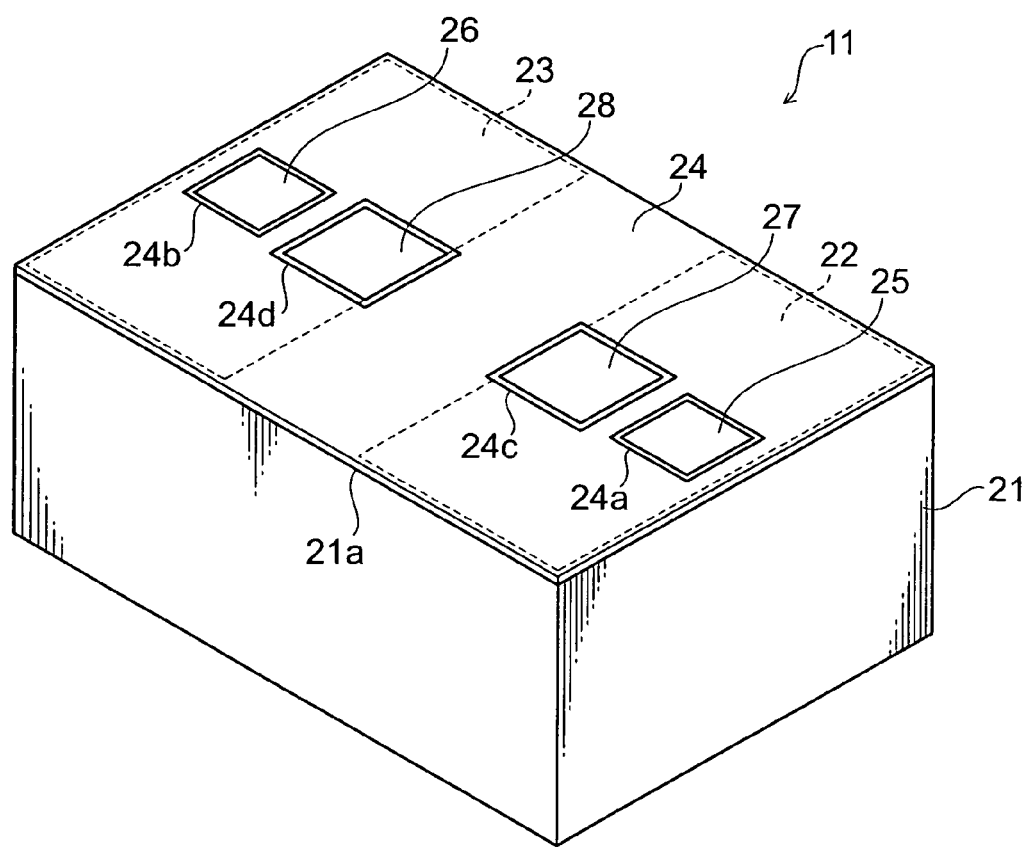
FIG. 2 is a schematic perspective view showing a multilayer chip varistor in the light emitting apparatus of the first embodiment.
Figure 3:
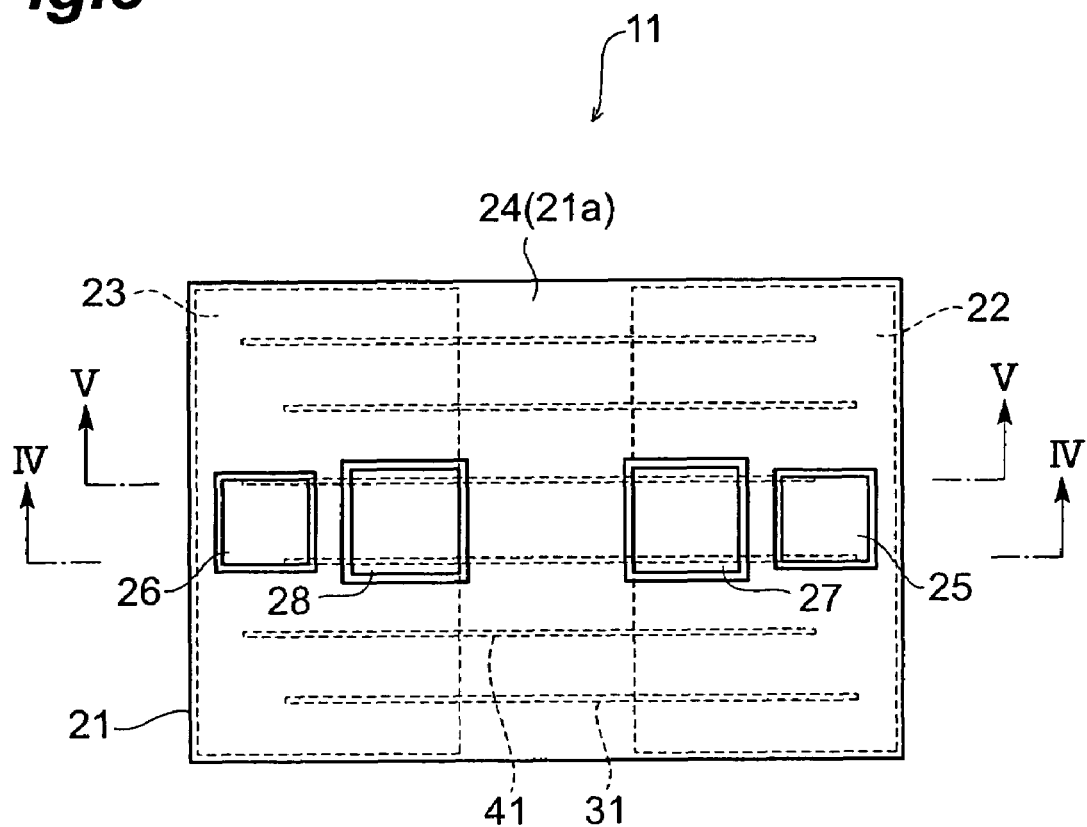
FIG. 3 is a schematic top view showing the multilayer chip varistor of the first embodiment.
Figure 4:
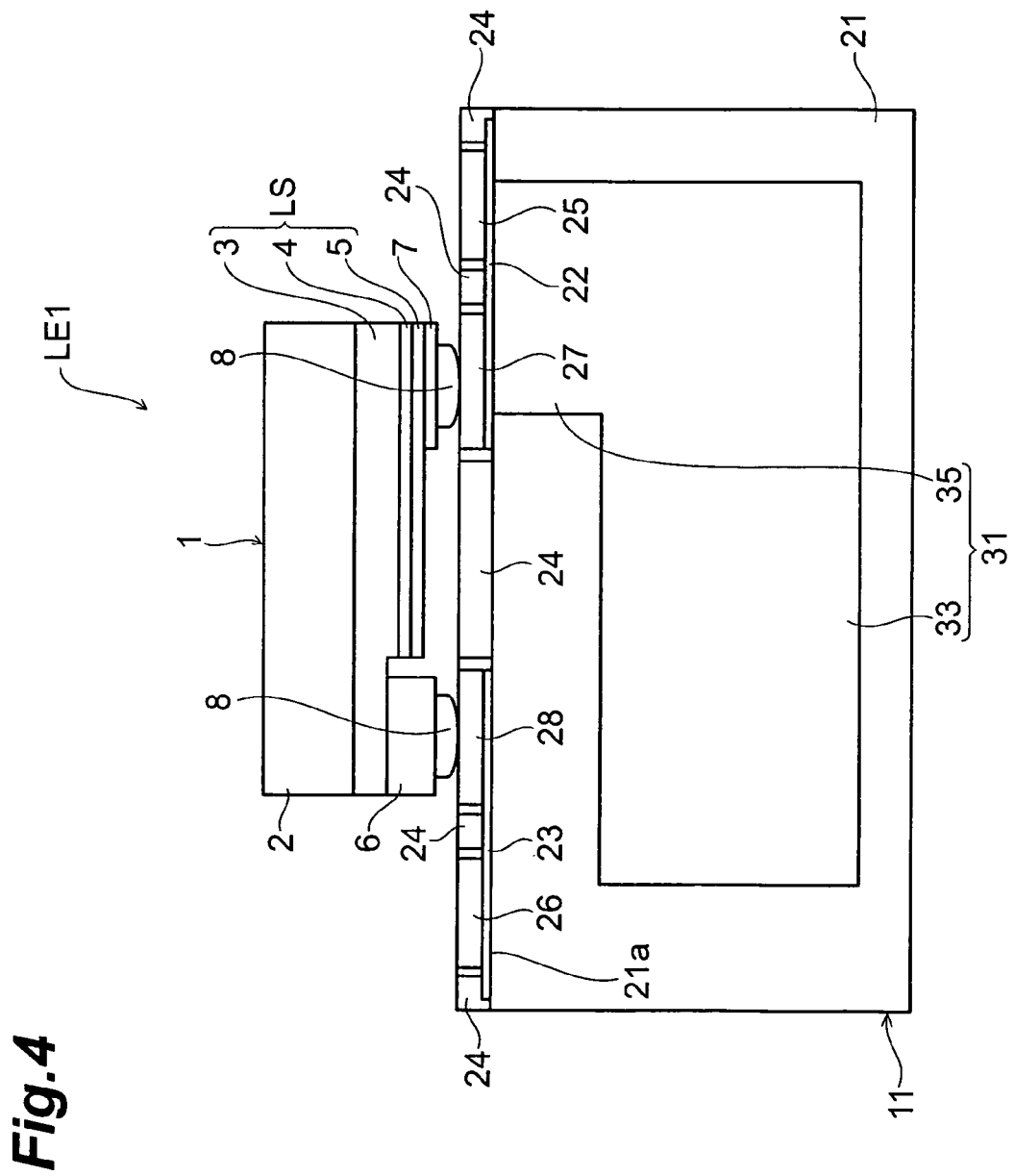
FIG. 4 is a drawing for explaining a sectional configuration along line IV-IV in FIG. 3.
Figure 5:
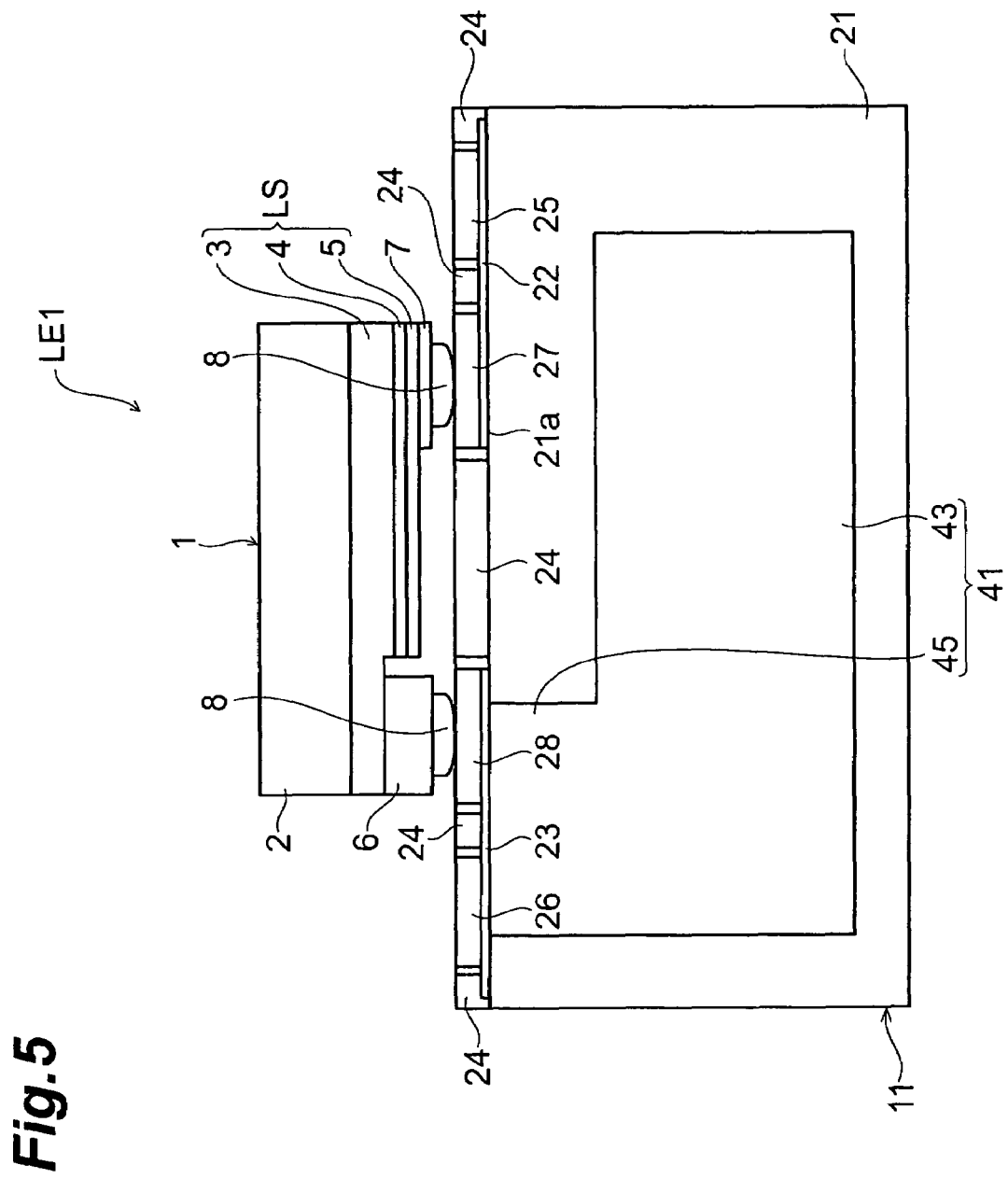
FIG. 5 is a drawing for explaining a sectional configuration along line V-V in FIG. 3.

A configuration of a light emitting apparatus LE1 according to the first embodiment will be described with reference to FIGS. 1 to 5. FIG. 1 is a schematic top view showing the light emitting apparatus according to the first embodiment. FIG. 2 is a schematic perspective view showing a multilayer chip varistor in the light emitting apparatus according to the first embodiment. FIG. 3 is a schematic top view showing the multilayer chip varistor in the light emitting apparatus according to the first embodiment. FIG. 4 is a drawing for explaining a sectional configuration along line IV-IV in FIG. 3. FIG. 5 is a drawing for explaining a sectional configuration along line V-V in FIG. 3.

The light emitting apparatus LE1, as shown in FIGS. 1, 4, and 5, has a semiconductor light emitting element 1, a reflecting layer 24, and a multilayer chip varistor 11.

First, the configuration of the multilayer chip varistor 11 will be described. As shown in FIG. 2, the multilayer chip varistor 11 has a varistor element body 21 (laminate body) of approximately rectangular parallelepiped shape, first external electrodes 22, 23, and second external electrodes 25, 26, 27, and 28. The first external electrodes 22, 23 and the second external electrodes 25, 26, 27, 28 are formed each on a principal surface (outer surface) 21a of the varistor element body 21. The varistor element body 21 is set, for example, to the length of about 1.0 mm, the width of about 0.5 mm, and the thickness of about 0.3 mm.

The varistor element body 21, as shown in FIG. 3, is a laminate body comprising of a lamination of a plurality of varistor layers to exhibit a nonlinear voltage-current characteristic (hereinafter referred to as "varistor characteristic"), a plurality of first internal electrodes 31, and a plurality of second internal electrodes 41. The first internal electrodes 31 and the second internal electrodes 41 are alternately arranged along the laminating direction of the varistor layers (hereinafter referred to simply as "laminating direction") in the varistor element body 21. The first internal electrodes 31 and the second internal electrodes 41 are arranged so as to interpose at least one varistor layer between them. The principal surface 21a of the varistor element body 21 extends in directions parallel to the laminating direction and parallel to the extending direction of the varistor layers. In practical multilayer chip varistor 11, the plurality of varistor layers are integrally formed so that no boundary can be visually recognized between the layers.

The varistor layers are made of an element material containing ZnO (zinc oxide) as a principal component and containing accessory components as follows: metals such as a rare-earth metal element, Co, a IIIb-group element (B, Al, Ga, In), Si, Cr, Mo, an alkali metal element (K, Rb, Cs), and an alkali-earth metal element (Mg, Ca, Sr, Ba), or oxides of these. In the present embodiment the varistor layers contain Pr, Co, Cr, Ca, Si, K, Al, etc. as accessory components. For this reason, the regions in the varistor layers overlapping with the first internal electrodes 31 and with the second internal electrodes 41 contain the principal component of ZnO and also contain Pr.

In the present embodiment Pr is used as a rare-earth metal. Pr is a material to exhibit the varistor characteristic. The reason why Pr is used is that it demonstrates excellent nonlinear voltage-current characteristic and little characteristic variation in mass production. There are no particular restrictions on the content of ZnO in the varistor layers, but it is normally 99.8-69.0% by mass, where the total amount of materials constituting the varistor layers is 100% by mass. The thickness of the varistor layers is, for example, approximately 5-60 μm.

Each first internal electrode 31, as shown in FIG. 4, includes a first electrode portion 33 and a second electrode portion 35. The first electrode portion 33 is of approximately rectangular shape. The first electrode portion 33 overlaps with a first electrode portion 43 of the second internal electrode 41 shown in FIG. 5, when viewed from the laminating direction. The second electrode portion 35 is led from the first electrode portion 33 so as to be exposed in the principal surface 21a of the varistor element body 21, and functions as a lead conductor. The second electrode portion 35 is physically and electrically connected to the first external electrode 22. The first electrode portion 33 is electrically connected through the second electrode portion 35 to the first external electrode 22. The second electrode portion 35 is formed integrally with the first electrode portion 33.

Each second internal electrode 41, as shown in FIG. 5, includes a first electrode portion 43 and a second electrode portion 45. The first electrode portion 43 is of approximately rectangular shape. The first electrode portion 43 overlaps with the first electrode portion 33 of the first internal electrode 31 shown in FIG. 4, when viewed from the laminating direction. The second electrode portion 45 is led from the first electrode portion 43 so as to be exposed in the principal surface 21a of the varistor element body 21, and functions as a lead conductor. The second electrode portion 45 is physically and electrically connected to the first external electrode 23. The first electrode portion 43 is electrically connected through the second electrode portion 45 to the first external electrode 23. The second electrode portion 45 is formed integrally with the first electrode portion 43.

The first and second internal electrodes 31, 41 contain an electrically conductive material. There are no particular restrictions on the electrically conductive material contained in the first and second internal electrodes 31, 41, but it preferably consists of Ag—Pd alloy. The thickness of the first and second internal electrodes 31, 41 is, for example, approximately 0.5-5 μm.

The first electrode portions 33 of the first internal electrodes 31 and the first electrode portions 43 of the second internal electrodes 41 are arranged so that the first electrode portion 43 of each second internal electrode 41 overlaps with the first electrode portion 33 of each adjacent first internal electrode 31, as described above. Therefore, the overlapping region in each varistor layer with the first electrode portion 33 and with the first electrode portion 43 functions as a region to exhibit the varistor characteristic. In the multilayer chip varistor 11 having the above-described configuration, the first electrode portions 33, the first electrode portions 43, and the regions in the varistor layers overlapping with the first electrode portions 33 and with the first electrode portions 43 constitute one varistor portion.

As shown in FIG. 2, the first external electrodes 22, 23 are located with a predetermined spacing (e.g., a spacing of 50 μm or more) in a direction perpendicular to the laminating direction of the varistor layers and parallel to the principal surface 21a, on the principal surface 21a of the varistor element body 21. The first external electrodes 22, 23 are of rectangular shape (oblong in the present embodiment). The first external electrodes 22, 23 contain Au and are formed by baking an electroconductive paste as described later. The electroconductive paste is one in which an organic binder and an organic solvent are mixed in a metal powder consisting primarily of Au particles.

The second external electrodes 25, 26, 27, 28 are formed on the first external electrodes 22, 23. The second external electrode 25 and the second external electrode 26 are located with a predetermined spacing in the direction perpendicular to the laminating direction of the varistor layers and parallel to the principal surface 21a, on the principal surface 21a. The second external electrode 25 is physically and electrically connected to the first external electrode 22, and the second external electrode 26 to the first external electrode 23. The second external electrodes 25, 26 are of rectangular shape (square in the present embodiment). The second external electrode 25 functions as an input terminal electrode of the multilayer chip varistor 11, and the second external electrode 26 as an output terminal electrode of the multilayer chip varistor 11.

The second external electrodes 27, 28 are arranged between the pair of second external electrodes 25, 26. The second external electrode 27 and the second external electrode 28 are located with a predetermined spacing in the direction perpendicular to the laminating direction of the varistor layers and parallel to the principal surface 21a, on the principal surface 21a. The second external electrode 27 is physically and electrically connected to the first external electrode 22, and the second external electrode 28 to the first external electrode 23. In this arrangement, the second external electrode 25 and the second external electrode 27 are electrically connected to each other through the first external electrode 22, and the second external electrode 26 and the second external electrode 28 are electrically connected to each other through the first external electrode 23. The second external electrodes 27, 28 are of rectangular shape (square in the present embodiment). The second external electrodes 27, 28 function as pad electrodes to be electrically connected to the semiconductor light emitting element 1 described later.

The second external electrodes 25-28 are formed, for example, by plating on the first external electrodes 22, 23. The second external electrodes 25-28 are made of Au or Pt. When the plating method is applied, the second external electrodes 25-28 are formed by evaporating Au or Pt by a vacuum coating method (vacuum evaporation, sputtering, ion plating, or the like). The second external electrodes 25-28 may be constructed as laminates of Pt/Au.

The reflecting layer 24 is arranged, as also shown in FIGS. 4 and 5, between the multilayer chip varistor 11 of the above configuration and the semiconductor light emitting element 1. The reflecting layer 24 is formed on a surface of the multilayer chip varistor 11 opposing the semiconductor light emitting element 1, i.e., on the principal surface 21a of the varistor element body 21. The reflecting layer 24 formed at this position reflects light traveling toward the multilayer chip varistor 11, out of light generated by the semiconductor light emitting element 1.

Specifically, the reflecting layer 24, as shown in FIG. 2, is formed so as to cover the principal surface 21a of the varistor element body 21. The reflecting layer 24 is formed on the first external electrodes 22, 23 and has apertures 24a-24d in regions where the second external electrodes 25-28 are located. The apertures 24a-24d are larger than the second external electrodes 25-28 and the second external electrodes 25-28 are arranged in centers of the respective apertures 24a-24d. The first external electrode 22 is exposed through the apertures 24a, 24c, and the first external electrode 23 is exposed through the apertures 24b, 24d. The second external electrode 25 is connected to the first external electrode 22 exposed through the aperture 24a, and the second external electrode 26 is connected to the first external electrode 23 exposed through the aperture 24b. The second external electrode 27 is connected to the first external electrode 22 exposed through the aperture 24c, and the second external electrode 28 is connected to the first external electrode 23 exposed through the aperture 24d.

The reflecting layer 24 can be formed using various materials. For example, the reflecting layer 24 contains a glass and an additive. In this case, the reflecting layer 24 is a layer in which the additive is dispersed in the glass. The reflecting layer 24 has electric insulation because of inclusion of the glass. When the reflecting layer 24 has electric insulation, it can prevent a short circuit between the first electrodes 22, 23. When the reflecting layer 24 contains the glass, the reflecting layer 24 becomes excellent in heat resistance.

The additive in the reflecting layer 24 can be a metal. The reflecting layer 24 containing the metal can securely reflect the light generated by the semiconductor light emitting element 1. When the metal is used, the reflecting layer 24 comes to have a good thermal conductivity, and thus can efficiently dissipate heat from the semiconductor light emitting element 1. Preferred examples of the metal include Ag, Al, Ti, Ni, etc. with the reflectance higher than those of the other common metals. Particularly, when Ag or Al is used, the reflecting layer 24 can have a higher reflection efficiency.

The additive can also be a metal oxide. The reflecting layer 24 containing the metal oxide can securely reflect the light generated by the semiconductor light emitting element 1. When the metal oxide is used, the reflecting layer 24 has the electric insulation much higher than that when the metal is used. Since the metal oxide has good dispersibility in the glass, it is easy to form the reflecting layer 24 with the metal oxide being uniformly dispersed and with little characteristic variation. Since the reflecting layer 24 contains the glass and metal oxide, the reflecting layer 24 can be obtained with a relatively small coefficient of thermal expansion and can be prevented from being distorted or broken or from cracking. Preferred examples of the metal oxide include $Al_2O_3$, $TiO_2$, $SiO_2$, $ZrO_2$, etc. with the reflectance higher than those of the other common metal oxides. Particularly, when $Al_2O_3$ is used, the reflecting layer 24 can have a much higher reflection efficiency.

Another applicable additive is a powder of a metal coated with a metal oxide. The metal oxide coating over the powder can be implemented, for example, by such a method as barrel sputtering, plasma oxidation, or thermal oxidation. When the powder is coated with the metal oxide, the powder of the metal can be improved in dispersibility in the glass. When the powder of the metal coated with the metal oxide is used, the reflecting layer 24 can be obtained with the property of the metal of a high reflection efficiency and with the property of the metal oxide of high electric insulation. Therefore, the reflecting layer 24 can have a much higher electric insulation without reduction in reflection efficiency. Particularly, when the additive is a powder of Ag coated with $Al_2O_3$ or a powder of Al coated with $Al_2O_3$, the reflecting layer 24 can have a much higher reflection efficiency.

The reflecting layer 24 may be one containing a resin and an additive. In this case, the reflecting layer 24 is a layer in which the additive is dispersed in the resin. When the reflecting layer contains the resin, the reflecting layer 24 can have electric insulation. It also becomes easier to form the reflecting layer 24 and good adhesion is achieved between the multilayer chip varistor 11 and the reflecting layer 24. It can also relax thermal stress imposed on the multilayer chip varistor 11. The resin is preferably at least one of silicone resin, polytetrafluoroethylene, polyethylene terephthalate, and xylene resin. When these resins are used, it is feasible to securely obtain the reflecting layer 24 with high electric insulation. It is also feasible to securely enhance easiness of formation of the reflecting layer 24 and adhesion between the multilayer chip varistor 11 and the reflecting layer 24. The additive can be a metal or a metal oxide, or a powder of a metal coated with a metal oxide, as in the case of the glass.

The reflecting layer 24 may be one having a thin film layer made of a metal. In this case, an insulating layer is formed below the thin film layer containing the metal, for the purpose of preventing a short circuit through the reflecting layer 24 between the first electrodes 22, 23. With the thin film layer containing the metal, it becomes feasible to securely reflect the light generated by the semiconductor light emitting element 1. When the thin film layer is used, the thickness of the reflecting layer 24 can be made smaller. Preferred examples of the metal in the thin film layer include Ag, Al, Ti, Ni, etc. with the reflectance higher than those of the other common metals. Particularly, when Ag or Al is used, the reflection efficiency of the reflecting layer 24 can be further enhanced.

Investigation was conducted about a variety of reflecting layers 24 as described above, and the reflecting layer 24 in the present embodiment was determined to be one containing a glass and Ag. When Ag is used, the reflecting layer 24 can have excellent reflection characteristics, particularly, for light of wavelength near 450 nm. As a result, the reflection efficiency of the reflecting layer 24 can be adequately enhanced.

The reflecting layer 24 containing the glass and Ag is formed, for example, by printing on the principal surface 21a of the varistor element body 21. When the printing method is applied, the reflecting layer 24 is formed by preparing a glass paste in which a glass powder, an Ag powder, an organic binder, and an organic solvent are mixed, printing the glass paste onto the first external electrodes 22, 23 and the principal surface 21a of the varistor element body 21, drying it, and baking it.

Figure 6:
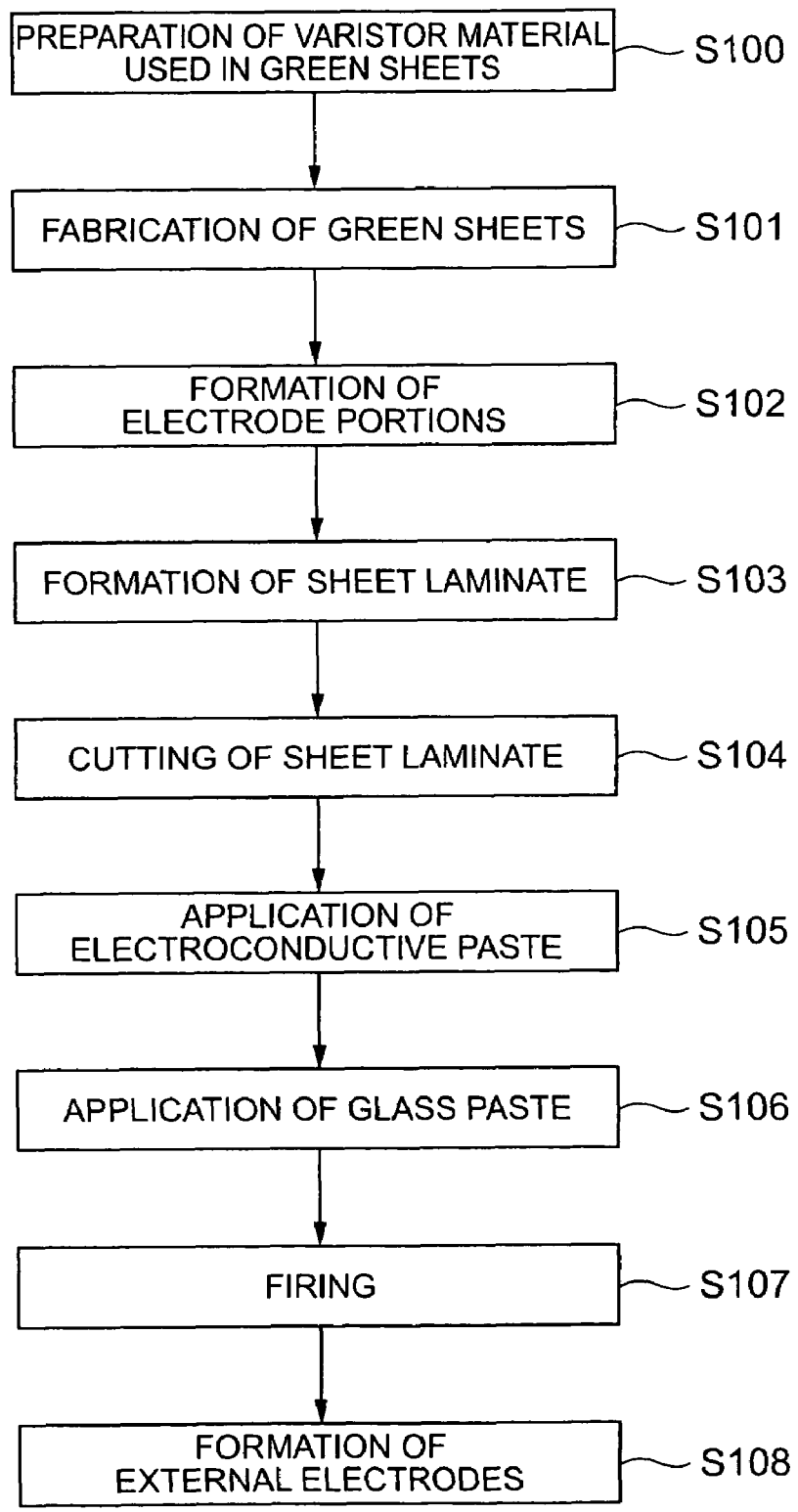
FIG. 6 is a flowchart for explaining a production process of the multilayer chip varistor and reflecting layer in the first embodiment.
Figure 7:
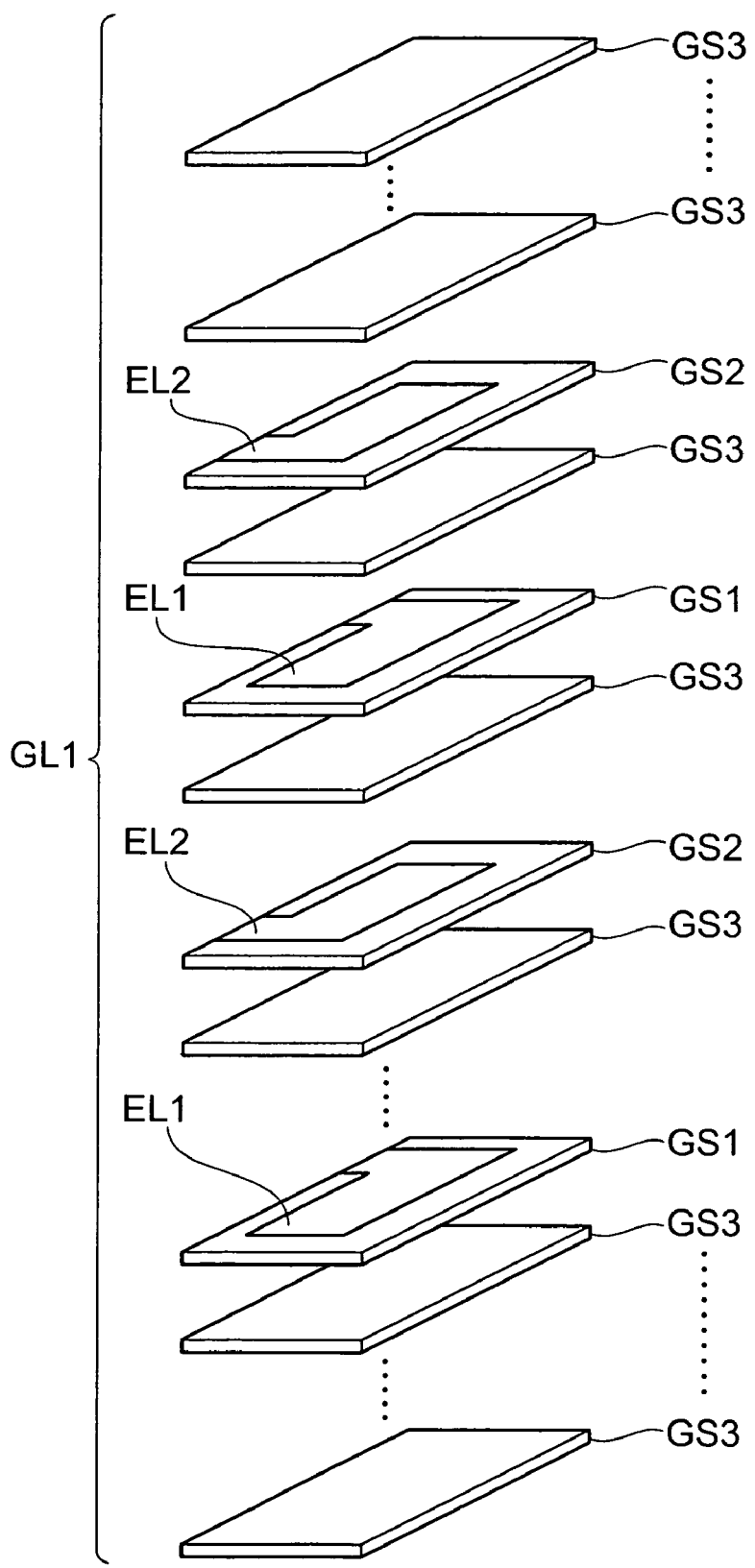
FIG. 7 is a drawing for explaining the production process of the multilayer chip varistor and reflecting layer in the first embodiment.
Figure 8:
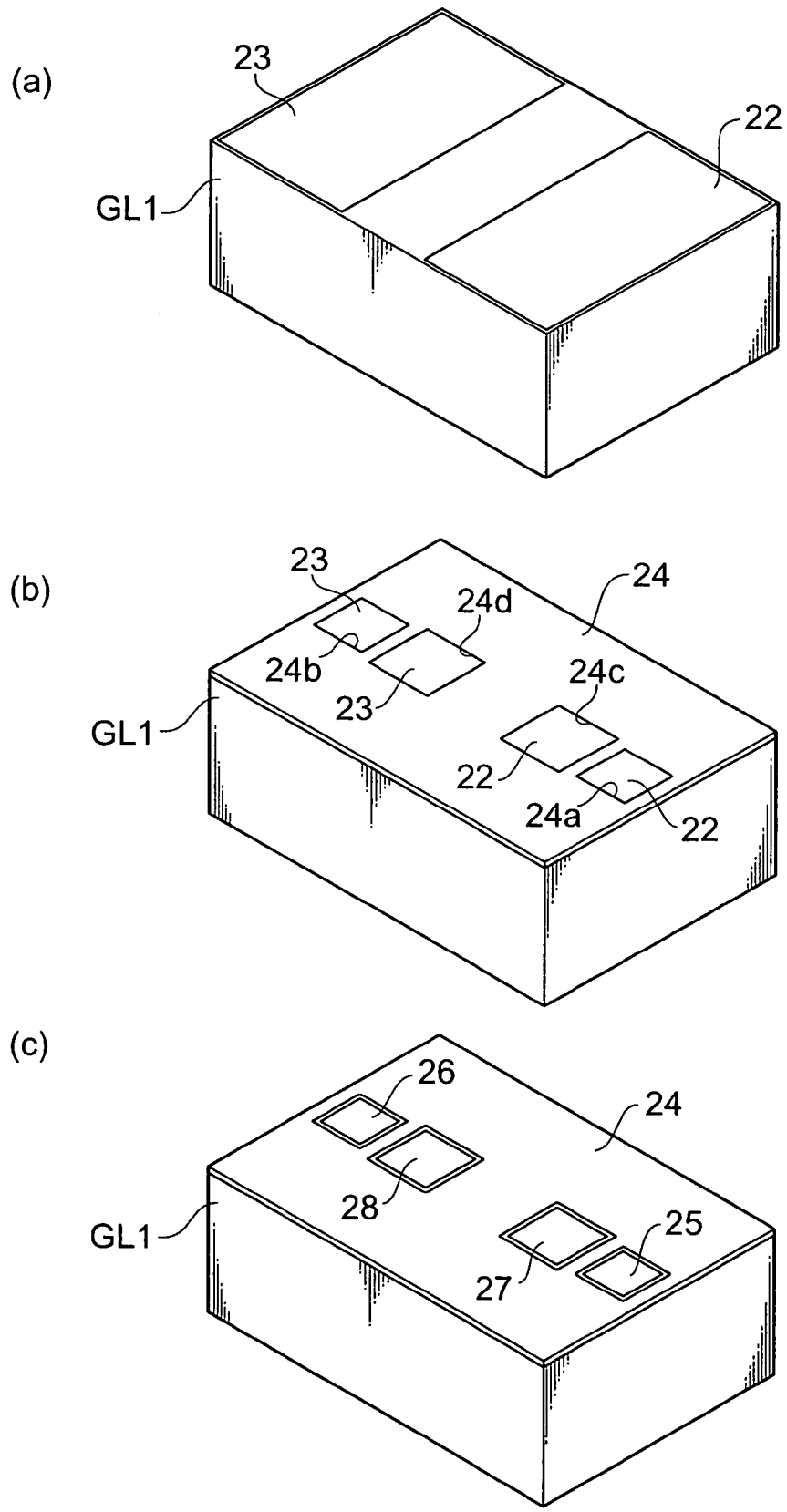
FIG. 8 is a drawing for explaining the production process of the multilayer chip varistor and reflecting layer in the first embodiment.

Subsequently, a production process of the multilayer chip varistor 11 and reflecting layer 24 of the above-described configuration will be described with reference to FIGS. 6 to 8. FIG. 6 is a flowchart for explaining the production process of the multilayer chip varistor and reflecting layer according to the first embodiment. FIGS. 7 and 8 are drawings for explaining the production process of the multilayer chip varistor and reflecting layer according to the first embodiment.

The first step is to weigh each of the principal component of ZnO of the varistor layers and the trace additives of metals or oxides or the like of Pr, Co, Cr, Ca, Si, K, and Al at a predetermined ratio and thereafter mix the components to prepare a varistor material (step S100). Thereafter, an organic binder, an organic solvent, an organic plasticizer, etc. are added into this varistor material, and the mixture is mixed and pulverized for about 20 hours with a ball mill or the like to obtain a slurry.

This slurry is applied onto a film, for example, of polyethylene terephthalate by a well-known method such as the doctor blade method, and thereafter it is dried to form membranes in the thickness of about 30 μm. The membranes obtained in this manner are separated from the film to obtain green sheets (step S101).

Next, a plurality of electrode portions corresponding to the first and second internal electrodes 31, 41 (in the number corresponding to the number of divided chips described later) are formed on the green sheets (step S102). The electrode portions corresponding to the first and second internal electrodes 31, 41 are formed by printing an electroconductive paste as a mixture of a metal powder consisting primarily of Ag—Pd alloy particles, an organic binder, and an organic solvent by a printing method such as screen printing, and drying it.

Then the green sheets with the electrode portions and green sheets without electrode portions are stacked in a predetermined order to form a sheet laminate (step S103). The sheet laminate obtained in this manner is cut in chip units to obtain a plurality of divided green bodies GL1 (cf. FIG. 7) (step S104). In each resultant green body GL1, the green sheets GS1 with the electrode portion EL1 corresponding to the first internal electrode 31, the green sheets GS2 with the electrode portion EL2 corresponding to the second internal electrode 41, and the green sheets GS3 without the electrode portions EL1, EL2 are successively stacked. Each of the green sheets GS3 located between the green sheets GS1 and the green sheets GS2 may be a stack of multiple sheets, or may be excluded.

Next, as shown in FIG. 8(a), an electroconductive paste for the first external electrodes 22, 23 is applied onto an outer surface of green body GL1 (step S105 in FIG. 6). In this step, the electrode portions corresponding to the first external electrodes 22, 23 are formed by printing the electroconductive paste in contact with the corresponding electrode portions EL1, EL2 by screen printing on the principal surface of the green body GL1 and then drying it. The electroconductive paste for the first external electrodes 22, 23 can be one in which an organic binder and an organic solvent are mixed in a metal powder consisting primarily of Au particles, as described above.

Next, as shown in FIG. 8(b), a glass paste for the reflecting layer 24 is applied onto the first external electrodes 22, 23 (step S106 in FIG. 6). In this step, the glass paste as a mixture of an Ag powder, a glass powder, an organic binder, and an organic solvent is printed and applied by a printing method such as screen printing. At this time, the glass paste is not printed and applied on the portions corresponding to the apertures 24a-24d, and thus the first external electrodes 22, 23 are exposed through the portions corresponding to the apertures 24a-24d. After the glass paste is printed and applied, it is dried to form a layer corresponding to the reflecting layer 24.

Then the green body GL1 with the glass paste thereon is subjected to a thermal treatment at 180-400° C. and for about 0.5-24 hours, to effect debindering, and thereafter it is further fired at 1000-1400° C. for about 0.5-8 hours (step S107 in FIG. 6) to obtain the varistor element body 21, the first external electrodes 22, 23, and the reflecting layer 24. This baking results in turning the green sheets GS1-GS3 in the green body GL1 into the varistor layers. The electrode portions EL1 turn into the first internal electrodes 31. The electrode portions EL2 turn into the second internal electrodes 41. After the firing, an alkali metal (e.g., Li, Na, or the like) may be diffused from the surface of the varistor element body 21.

After the varistor element body 21, first external electrodes 22, 23, and reflecting layer 24 are formed in this manner, the second external electrodes 25-28 are formed on the first external electrodes 22, 23 (step S108). In this step, the second external electrodes 25-28 are formed by evaporation of Au in the central regions of the apertures 24a-24d in the reflecting layer 24 by a vacuum coating method. The above process provides the multilayer chip varistor 11 with the reflecting layer 24 thereon.

Next, the configuration of the semiconductor light emitting element 1 will be described with reference to FIGS. 4 and 5.

The semiconductor light emitting element 1 is a Light-Emitting Diode (LED) of a GaN (gallium nitride) semiconductor and has a substrate 2, and a layer structure LS formed on the substrate 2. The GaN semiconductor LED is well known and the description thereof is simplified herein. The substrate 2 is an optically transparent and electrically insulating substrate made of sapphire. The layer structure LS includes an n-type (first conductivity type) semiconductor region 3, a light-emitting layer 4, and a p-type (second conductivity type) semiconductor region 5 which are laminated. The semiconductor light emitting element 1 emits light according to a voltage applied between the n-type semiconductor region 3 and the p-type semiconductor region 5.

The n-type semiconductor region 3 contains an n-type nitride semiconductor. In the present embodiment, the n-type semiconductor region 3 is formed by epitaxially growing GaN on the substrate 2 and doping it, for example, with an n-type dopant such as Si to have the n-type conductivity. The n-type semiconductor region 3 may have a composition to achieve a smaller refractive index and a larger bandgap than those of the light-emitting layer 4. In this case, the n-type semiconductor region 3 serves as a lower cladding for the light-emitting layer 4.

The light-emitting layer 4 generates light in a luminous region through recombination of carriers (electrons and holes) supplied from the n-type semiconductor region 3 and from the p-type semiconductor region 5. The light-emitting layer 4 can be, for example, one of a Multiple Quantum Well (MQW) structure in which barrier layers and well layers are alternately stacked over multiple cycles. In this case, the barrier layers and well layers are constructed of InGaN and composition ratios of In (indium) are properly selected so that the bandgap of the barrier layers is larger than the bandgap of the well layers. The luminous region appears in a region into which the carriers are injected, in the light-emitting layer 4.

The p-type semiconductor region 5 contains a p-type nitride semiconductor. In the present embodiment, the p-type semiconductor region 5 is formed by epitaxially growing AlGaN on the light-emitting layer 4 and doping it, for example, with a p-type dopant such as Mg to have the p-type conductivity. The p-type semiconductor region 5 may have a composition to achieve a smaller refractive index and a larger bandgap than those of the light-emitting layer 4. In this case, the p-type semiconductor region 5 serves as an upper cladding for the light-emitting layer 4.

A cathode electrode 6 is formed on the n-type semiconductor region 3. The cathode electrode 6 is made of an electrically conductive material and ohmic contact is established between the cathode electrode 6 and the n-type semiconductor region 3. An anode electrode 7 is formed on the p-type semiconductor region 5. The anode electrode 7 is made of an electrically conductive material and ohmic contact is established between the anode electrode 7 and the p-type semiconductor region 5. Bump electrodes 8 are formed on the cathode electrode 6 and on the anode electrode 7.

In the semiconductor light emitting element 1 of the above-described configuration, a predetermined voltage is applied between the anode electrode 7 (bump electrode 8) and the cathode electrode 6 (bump electrode 8) to flow an electric current, whereupon light is generated in the luminous region of the light-emitting layer 4. This light is reflected by the reflecting layer 24.

The semiconductor light emitting element 1 is flip-chip bonded to the pair of second external electrodes 27, 28. Namely, the cathode electrode 6 is electrically and physically connected through the bump electrode 8 to the second external electrode 28. By this connection through the bump electrode 8, the semiconductor light emitting element 1 can be placed on the multilayer chip varistor 11, without need for provision of a support member for supporting the semiconductor light emitting element 1. The anode electrode 7 is electrically and physically connected through the bump electrode 8 to the second external electrode 27. This results in connecting the varistor portion comprised of the first electrode portions 33, the first electrode portions 43, and the regions in the varistor layers overlapping with the first electrode portions 33, 43, in parallel to the semiconductor light emitting element 1. Therefore, the semiconductor light emitting element 1 can be protected from an ESD surge. Heat generated in the semiconductor light emitting element 1 is transferred mainly to the external electrodes 27, 28 and internal electrodes 31, 41 to be dissipated. Since heat radiation paths are expanded for the heat generated in the semiconductor light emitting element 1, the heat generated in the semiconductor light emitting element 1 can be efficiently dissipated.

During the generation of heat in the semiconductor light emitting element 1, light is generated from the luminous region in the light-emitting layer 4. This light is radiated from the semiconductor light emitting element 1 toward the outside. Among the radiated light, light traveling toward the multilayer chip varistor 11 is reflected by the reflecting layer 24 formed on the multilayer chip varistor 11. This results in generating reflected light. When the reflected light is generated in this manner, the luminous efficiency can be increased.

As described above, the first embodiment is provided with the reflecting layer 24, and thus the light generated by the semiconductor light emitting element 1 can be reflected by the reflecting layer 24. Since the reflecting layer 24 is formed at the position between the multilayer chip varistor 11 and the semiconductor light emitting element 1, there is no need for securing an extra space for installation of the reflecting layer 24 around the semiconductor light emitting element 1. Therefore, the light emitting apparatus LE1 can be downsized.

Incidentally, when the apparatus is constructed with the semiconductor light emitting element 1 being located on the multilayer chip varistor 11 as in the light emitting apparatus LE1 of the first embodiment, part of the light generated by the semiconductor light emitting element 1 travels toward the multilayer chip varistor 11. If the light traveling in this direction is interrupted by the multilayer chip varistor 11, it will degrade the luminous efficiency. However, since in the present embodiment the reflecting layer 24 is located between the multilayer chip varistor 11 and the semiconductor light emitting element 1, the light traveling toward the multilayer chip varistor 11 can be reflected with certainty. Therefore, the light emitting apparatus LE1 can achieve a high luminous efficiency.

In the first embodiment, the reflecting layer 24 is formed on the surface of the multilayer chip varistor 11 opposing the semiconductor light emitting element 1, i.e., on the principal surface 21*a* of the varistor element body 21. This permits the reflecting layer 24 and the multilayer chip varistor 11 to be formed together. In consequence, the semiconductor light emitting element 1 can be placed on the integral body of the reflecting layer 24 and the multilayer chip varistor 11, which facilitates the assembly of the semiconductor light emitting apparatus LE1.

In the first embodiment, the reflecting layer 24 contains the glass and Ag. When containing Ag, the reflecting layer 24 can have excellent reflection characteristics, particularly, for light of wavelength near 450 nm. As a result, the reflection efficiency of the reflecting layer 24 can be further enhanced. Since the reflecting layer 24 contains the glass, the reflecting layer 24 can have excellent electric insulation and heat resistance.

In the first embodiment, the semiconductor light emitting element 1 is flip-chip bonded onto the multilayer chip varistor 11. In this case, the semiconductor light emitting element 1 can be placed on the multilayer chip varistor 11, without need for provision of a support member for supporting the semiconductor light emitting element 1. As a result, the apparatus can be further downsized.

The light emitting apparatus LE1 is preferably installed in a heat sink 53, as shown in FIG. 9. In FIG. 9, (a) is a schematic top view showing a state in which the light emitting apparatus of the first embodiment is installed. In FIG. 9, (b) is a view for explaining a sectional configuration along line IX-IX in (a). The heat sink 53 has a recess portion. The multilayer chip varistor 11 part is housed in the recess portion. The heat sink 53 has external electrodes 55, 56. The second external electrode 25 of the multilayer chip varistor 11 housed in the recess portion is connected through a wire to the external electrode 55 of the heat sink 53. The second external electrode 26 of the multilayer chip varistor 11 is connected through a wire to the external electrode 56 of the heat sink 53. The second external electrodes 25, 26 of the multilayer chip varistor 11 are electrically connected to an external circuit or the like through the external electrodes 55, 56 of the heat sink 53. When the light emitting apparatus LE1 is installed in the heat sink 53 in this manner, the heat generated in the semiconductor light emitting element 1 of the light emitting apparatus LE1 can be dissipated through the multilayer chip varistor 11 to the heat sink 53.

Second Embodiment

Figure 10:
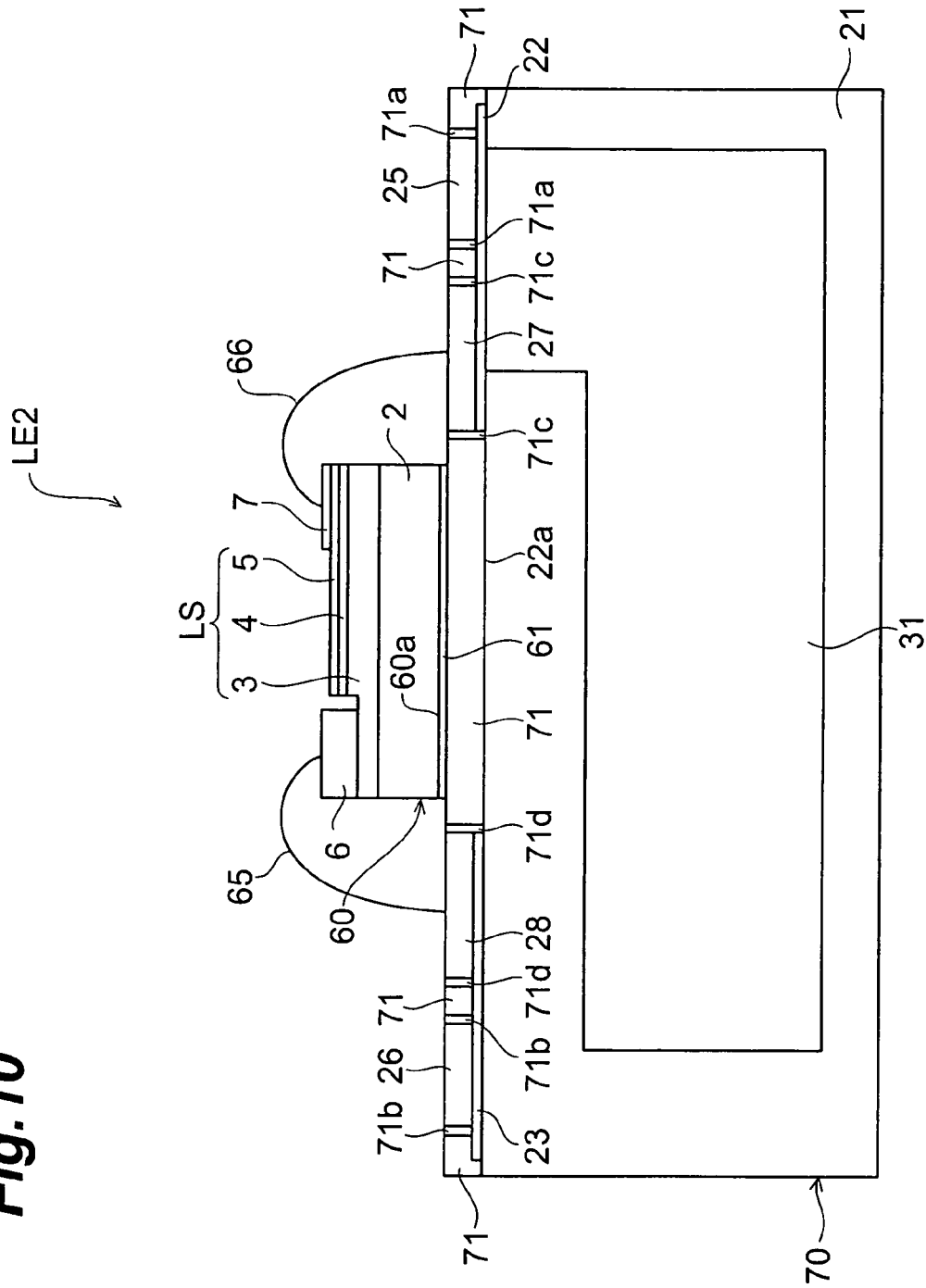
FIG. 10 is a drawing for explaining a sectional configuration of a light emitting apparatus according to the second embodiment.

A configuration of a light emitting apparatus LE2 according to the second embodiment will be described with reference to FIG. 10. FIG. 10 is a drawing for explaining a sectional configuration of the light emitting apparatus according to the second embodiment. The light emitting apparatus LE2 of the second embodiment is different in the location of the reflecting layer, the configuration of the multilayer chip varistor, and the configuration of the light emitter from the light emitting apparatus LE1 of the first embodiment.

The light emitting apparatus LE2, as shown in FIG. 10, has a semiconductor light emitting element 60 and a multilayer chip varistor 70. The semiconductor light emitting element 60 is wire bonded onto the multilayer chip varistor 70.

The multilayer chip varistor 70 has a varistor element body 21, first external electrodes 22, 23 formed each on the varistor element body 21, and second external electrodes 25-28 formed each on the first external electrode 22 or 23.

The multilayer chip varistor 70 has an insulating layer 71. The insulating layer 71 is of the same shape as the reflecting layer 24 in the light emitting apparatus LE1 of the first embodiment. Namely, the insulating layer 71 is formed so as to cover the principal surface 21a of the varistor element body 21 of the multilayer chip varistor 70. The insulating layer 71 is formed on the first external electrodes 22, 23 and has apertures 71a-71d in the regions where the second external electrodes 25-28 are located. The first external electrode 22 is exposed through the apertures 71a, 71c, and the first external electrode 23 is exposed through the apertures 71b, 71d. The apertures 71a-71d are larger than the second external electrodes 25-28 and the second external electrodes 25-28 are located in the centers of the apertures 71a-71d.

The semiconductor light emitting element 60 has a substrate 2, and a layer structure LS formed on the substrate 2 as the semiconductor light emitting element 1 in the light emitting apparatus LE1 of the first embodiment did. The layer structure LS includes an n-type (first conductivity type) semiconductor region 3, a light-emitting layer 4, and a p-type (second conductivity type) semiconductor region 5. A cathode electrode 6 is formed on the n-type semiconductor region 3. An anode electrode 7 is formed on the p-type semiconductor region 5.

The semiconductor light emitting element 60 is different from the semiconductor light emitting element 1 in the light emitting apparatus LE1 of the first embodiment in that the semiconductor light emitting element 60 is constructed without bump electrodes 7, 8. The semiconductor light emitting element 60 without bump electrodes is wire bonded to the pair of second external electrodes 27, 28. Namely, the cathode electrode 6 is electrically and physically connected through a wire 65 to the second external electrode 28. The anode electrode 7 is electrically and physically connected through a wire 66 to the second external electrode 27.

A reflecting layer 61 is formed on a surface 60a of the semiconductor light emitting element 60 opposing the multilayer chip varistor 70. The reflecting layer 61 is formed so as to cover the principal surface 60a of the semiconductor light emitting element 60. The reflecting layer 61 contains a glass and $Al_2O_3$. The reflecting layer 61 containing $Al_2O_3$ as a metal oxide is able to efficiently reflect light generated by the semiconductor light emitting element 60. The reflecting layer 61 is also excellent in electric insulation. Furthermore, the reflecting layer 61 has the coefficient of thermal expansion smaller than that of the reflecting layer containing metal, and thus the reflecting layer 61 is unlikely to suffer distortion or breakage, or crack. Therefore, when the reflecting layer 61 is thus provided, it can also protect the semiconductor light emitting element 60. Since $Al_2O_3$ has good dispersibility in glass, it is easy to form the reflecting layer 61 in which $Al_2O_3$ is uniformly dispersed.

In the second embodiment having the above-described configuration, the reflecting layer 61 is formed on the surface of the semiconductor light emitting element 60 opposing the multilayer chip varistor 70, i.e., on the principal surface 60a of the semiconductor light emitting element 60. This enables the reflecting layer 61 to securely reflect the light traveling toward the multilayer chip varistor 70, out of the light emitted by the semiconductor light emitting element 60. Therefore, a high luminous efficiency can be achieved. In addition, when the reflecting layer 61 is formed at the position as described above, there is no need for providing an extra space for installation of the reflecting layer 61 around the semiconductor light emitting element 60. Accordingly, the light emitting apparatus LE2 can be downsized. Furthermore, since the reflecting layer 61 and the semiconductor light emitting element 60 are formed together, it becomes easy to assemble the light emitting apparatus LE2.

In the second embodiment, the semiconductor light emitting element 60 is wire bonded onto the multilayer chip varistor 70. In this case, the semiconductor light emitting element 60 can be placed on the multilayer chip varistor 70, without need for provision of a support member for supporting the semiconductor light emitting element 60, whereby the light emitting apparatus LE2 can be further downsized.

Third Embodiment

Figure 11:
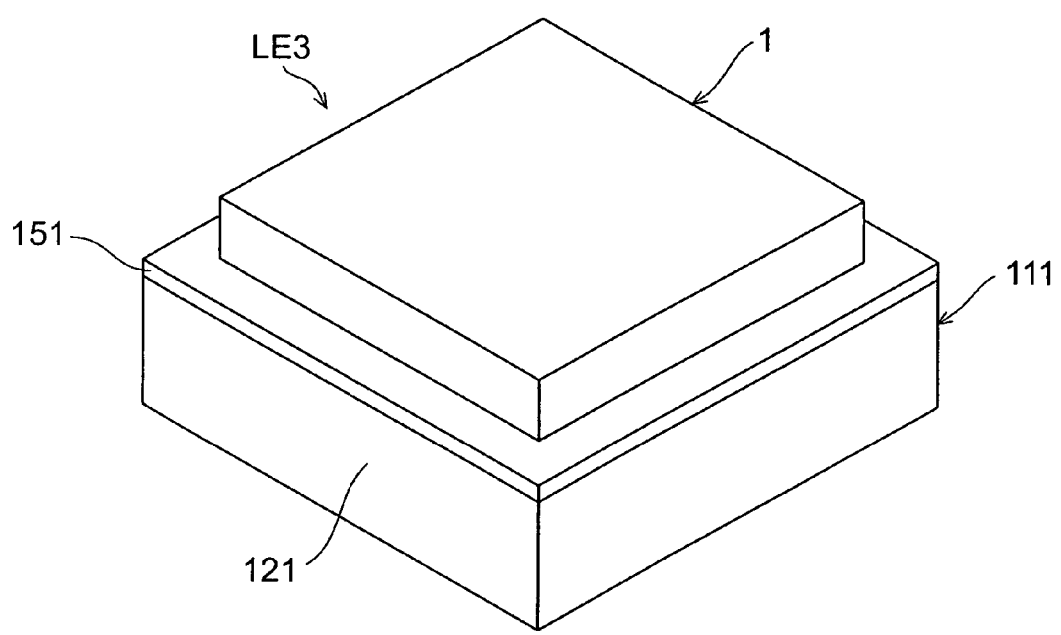
FIG. 11 is a perspective view showing a light emitting apparatus according to the third embodiment.
Figure 12:
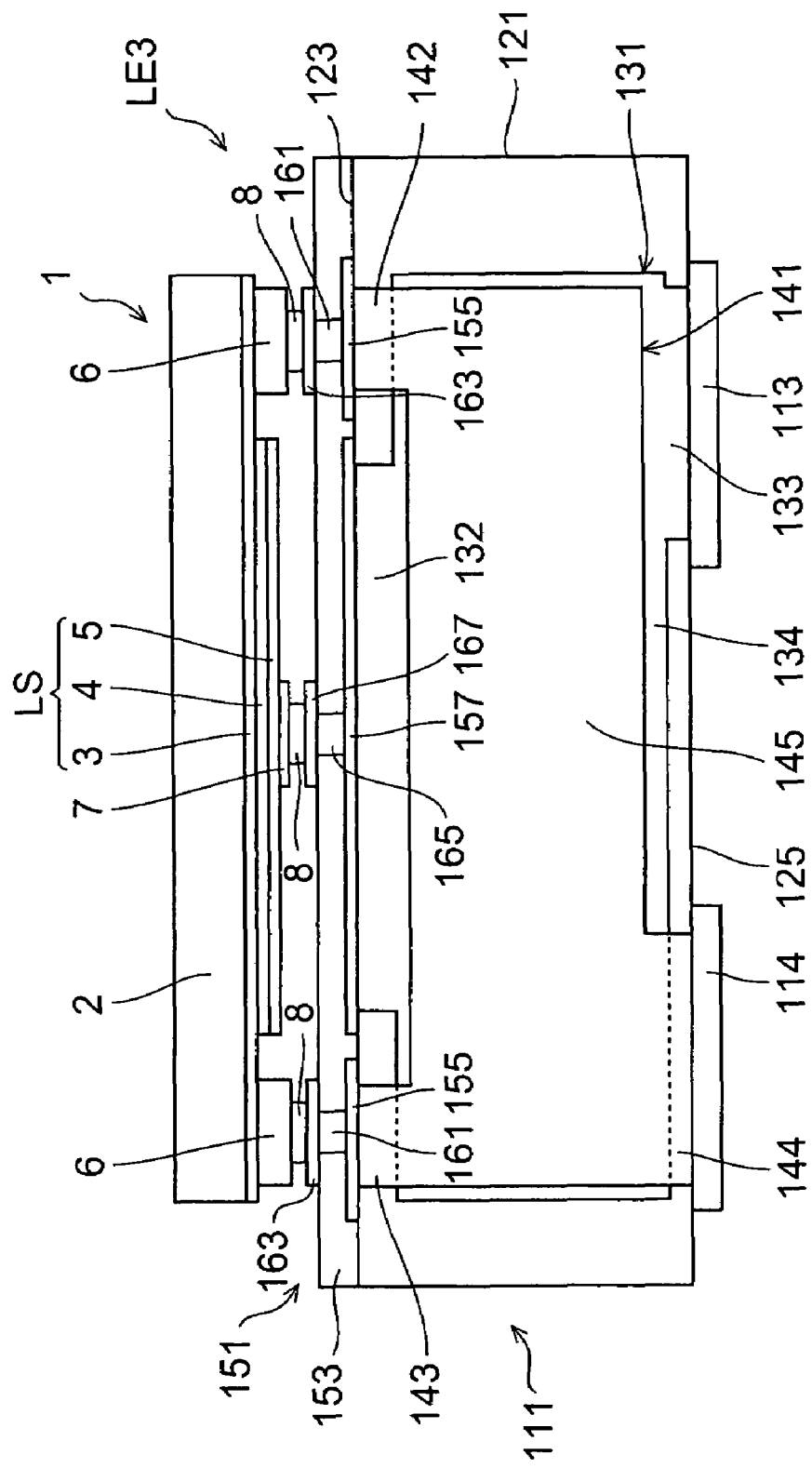
FIG. 12 is a drawing for explaining a sectional configuration of the light emitting apparatus according to the third embodiment.
Figure 13:
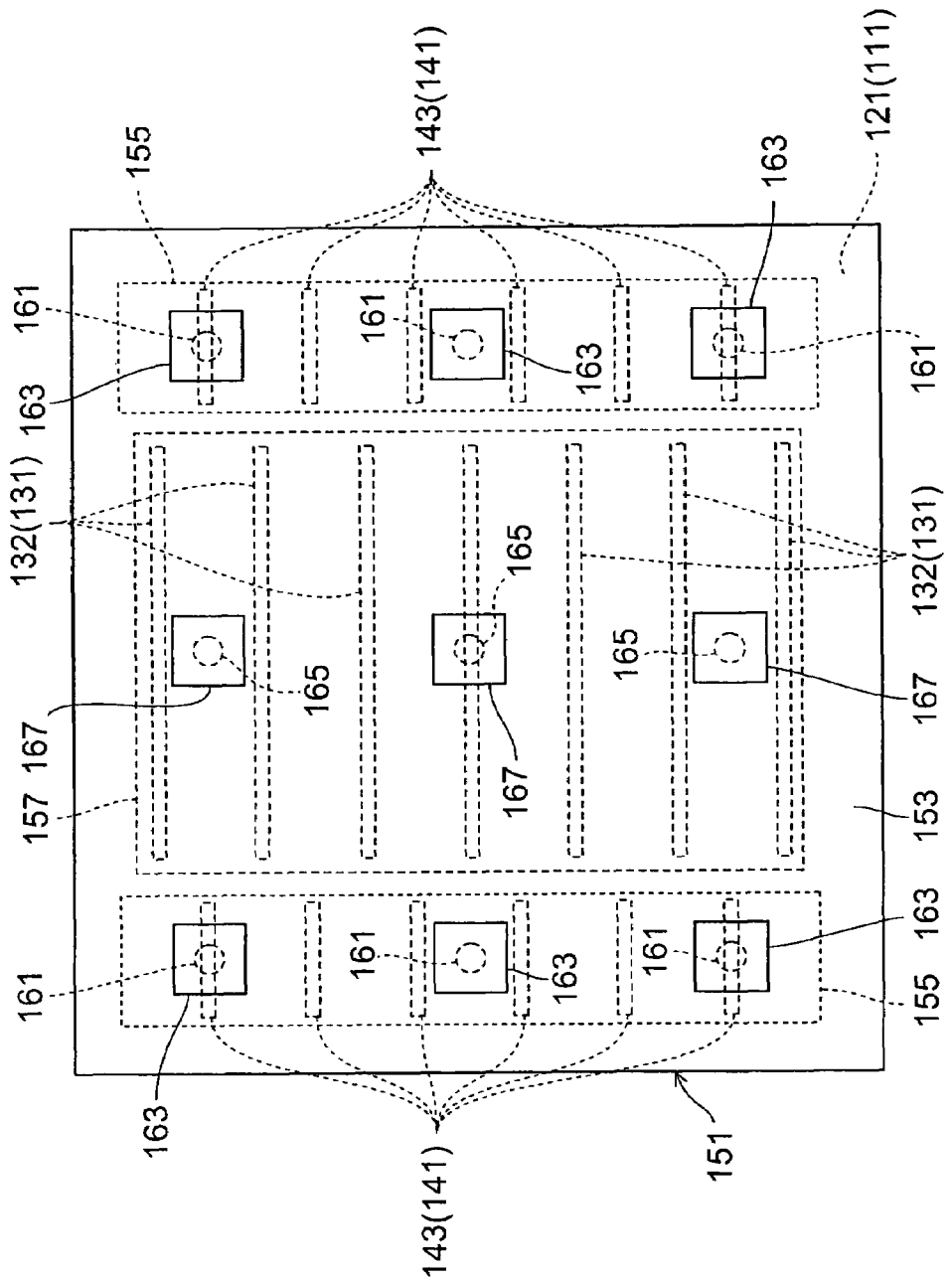
FIG. 13 is a top view showing a reflecting portion and multilayer chip varistor in the light emitting apparatus of the third embodiment.
Figure 14:
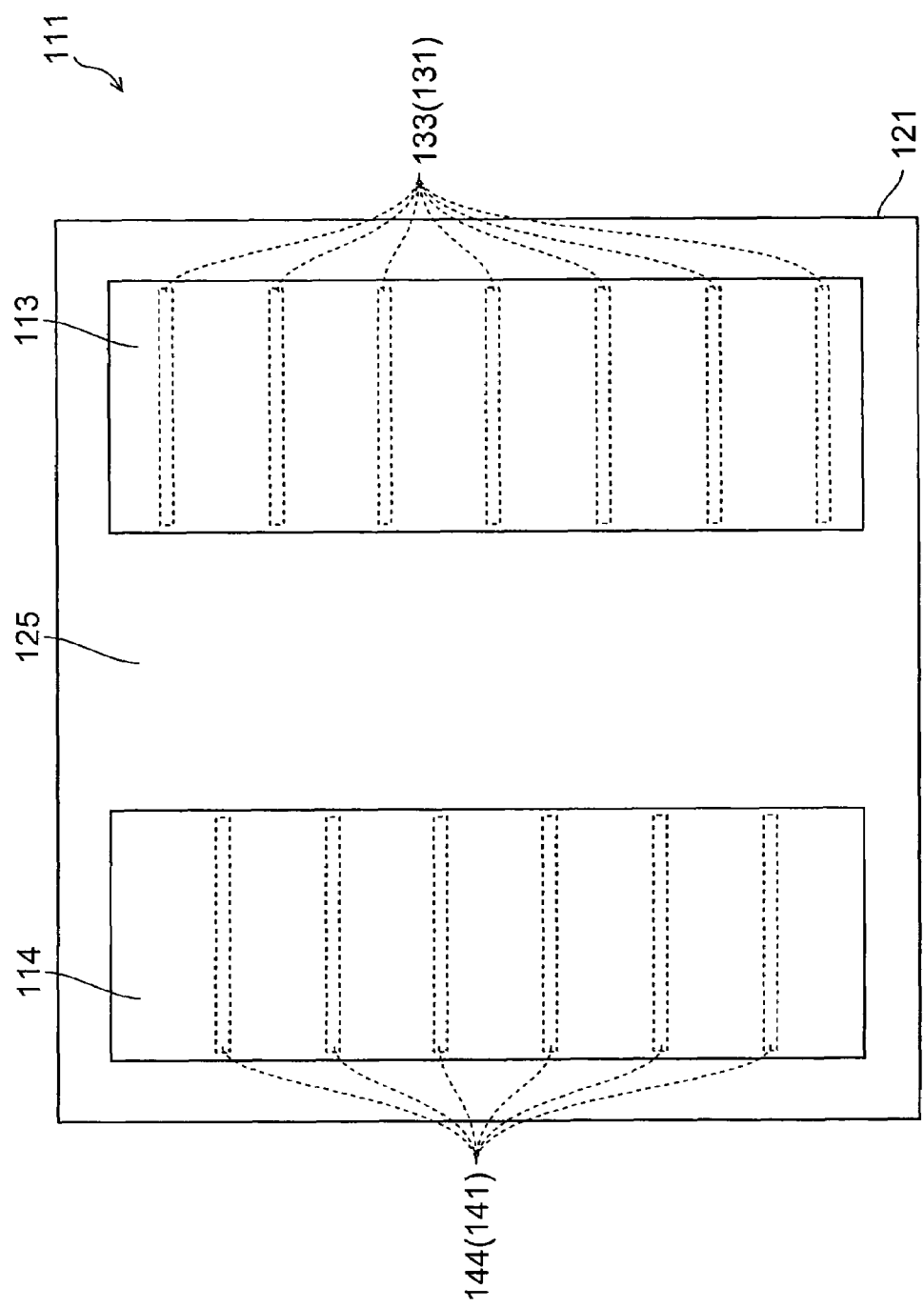
FIG. 14 is a bottom view showing the multilayer chip varistor in the light emitting apparatus of the third embodiment.

A configuration of a light emitting apparatus LE3 according to the third embodiment will be described with reference to FIGS. 11 to 14. FIG. 11 is a perspective view showing the light emitting apparatus according to the third embodiment. FIG. 12 is a drawing for explaining a sectional configuration of the light emitting apparatus according to the third embodiment. FIG. 13 is a top view showing a reflecting portion and multilayer chip varistor in the light emitting apparatus according to the third embodiment. FIG. 14 is a bottom view showing the multilayer chip varistor in the light emitting apparatus according to the third embodiment.

The light emitting apparatus LE3, as shown in FIGS. 11 and 12, has a semiconductor light emitting element 1, a multilayer chip varistor 111, and a reflecting portion 151. The semiconductor light emitting element 1 is located above the multilayer chip varistor 111. The reflecting portion 151 is located between the semiconductor light emitting element 1 and the multilayer chip varistor 111. The semiconductor light emitting element 1 is covered by a silicone resin containing fine particles of a phosphor.

First, the configuration of the multilayer chip varistor 111 will be described. The multilayer chip varistor 111 has a varistor element body 121 of approximately rectangular parallelepiped shape, and a plurality (a pair in the present embodiment) of external electrodes 113, 114.

The varistor element body 121 is constructed as a laminate body in which a plurality of varistor layers to exhibit the nonlinear voltage-current characteristic (hereinafter referred to as "varistor characteristic"), and a plurality of first internal electrodes 131 and second internal electrodes 141 are stacked. The first internal electrodes 131 and the second internal electrodes 141 are alternately arranged as plural layers each along the laminating direction of varistor layers (hereinafter referred to simply as "laminating direction") in the varistor element body 121.

The first internal electrodes 131 and the second internal electrodes 141 are opposed to each other so as to interpose at least one varistor layer between them. A pair of principal surfaces (outer surfaces) 123, 125 of the varistor element body 121 extend in directions parallel to the laminating direction of the varistor layers and parallel to the varistor layers. Namely, the pair of principal surfaces 123, 125 extend in parallel with the opposing direction of the first and second internal electrodes 131, 141 and are perpendicular to the first internal electrodes 131 and the second internal electrodes 141. The first internal electrodes 131 and the second internal electrodes 141 are juxtaposed along the laminating direction of the varistor layers. In practical multilayer chip varistor 111, the plurality of varistor layers are integrally formed so that no boundary can be visually recognized between them.

The varistor layers consist of an element material containing ZnO (zinc oxide) as a principal component and also containing accessory components of Co, and a rare-earth metal element or Bi. Furthermore, the element material contains metals such as a IIIb-group element (B, Al, Ga, In), Si, Cr, Mo, an alkali metal element (K, Rb, Cs), and an alkali-earth metal element (Mg, Ca, Sr, Ba), or oxides of these. In the present embodiment, the varistor layers contain Pr, Co, Cr, Ca, Si, K, Al, etc. as accessory components.

In the present embodiment, Pr is used as the rare-earth metal. Pr is a material to exhibit the varistor characteristic. The reason why Pr is used is that it demonstrates excellent nonlinear voltage-current characteristic and little characteristic variation in mass production. There are no particular restrictions on the content of ZnO in the varistor layers, but it is normally 99.8-69.0% by mass, where the total amount of the materials constituting the varistor layers is 100% by mass. The thickness of the varistor layers is, for example, approximately 5-60 μm.

The pair of external electrodes 113, 114, as also shown in FIG. 14, are formed each on the other principal surface 125 of the varistor element body 121. The varistor element body 121 is set, for example, to the length of about 0.5-2.0 mm, the width of about 0.5-2.0 mm, and the thickness of about 0.3 mm. The external electrode 113 functions as an input terminal electrode of the multilayer chip varistor 111, and the external electrode 114 as an output terminal electrode of the multilayer chip varistor 111.

Each first internal electrode 131 includes a first electrode portion 132, a second electrode portion 133, and a third electrode portion 134. The third electrode portion 134 overlaps with a fourth electrode portion 145 of second internal electrode 141 described later, when viewed from the laminating direction. The third electrode portion 134 is of approximately rectangular shape.

The second electrode portion 133 is led from the third electrode portion 134 so as to be exposed in the other principal surface 125, and functions as a lead conductor. The second electrode portion 133 is physically and electrically connected to the external electrode 113. The first electrode portion 132 is led from the third electrode portion 134 so as to be exposed in one principal surface 123, and functions as a lead conductor. The third electrode portion 134 is electrically connected through the second electrode portion 133 to the external electrode 113. The first electrode portion 132 and the second electrode portion 133 are formed integrally with the third electrode portion 134.

Each second internal electrode 141 includes a first electrode portion 142, a second electrode portion 143, a third electrode portion 144, and a fourth electrode portion 145. The fourth electrode portion 145 overlaps with the third electrode portion 134 of first internal electrode 131, when viewed from the laminating direction. The fourth electrode portion 145 is of approximately rectangular shape.

The third electrode portion 144 is led from the fourth electrode portion 145 so as to be exposed in the other principal surface 125, and functions as a lead conductor. The third electrode portion 144 is physically and electrically connected to the external electrode 114. The first electrode portion 142 and the second electrode portion 143 are led from the fourth electrode portion 145 so as to be exposed in one principal surface 123, and function as lead conductors. The fourth electrode portion 145 is electrically connected through the third electrode portion 144 to the external electrode 114. The first electrode portion 142, second electrode portion 143, and third electrode portion 134 are formed integrally with the fourth electrode portion 145.

The first and second internal electrodes 131, 141 contain an electrically conductive material. There are no particular restrictions on the electrically conductive material in the first and second internal electrodes 131, 141, but it is preferably Pd or Ag—Pd alloy or Ag. The thickness of the first and second internal electrodes 131, 141 is, for example, approximately 0.5-5 μm.

The external electrode 113 and the external electrode 114 are located with a predetermined spacing in a direction perpendicular to the laminating direction of the varistor layers and parallel to one principal surface 123, on the other principal surface 125. The external electrodes 113, 114 are of rectangular shape.

The third electrode portion 134 of the first internal electrode 131 and the fourth electrode portion 145 of the second internal electrode 141 overlap each other between the first internal electrode 131 and second internal electrode 141 adjacent to each other, as described above. Therefore, the regions in the varistor layers overlapping with the third electrode portions 134 and with the fourth electrode portions 145 function as regions to exhibit the varistor characteristic. In the multilayer chip varistor 111 having the above-described configuration, the third electrode portions 134, the fourth electrode portions 145, and the regions in the varistor layers overlapping with the third electrode portions 134 and the fourth electrode portions 145 constitute one varistor portion.

Figure 15:
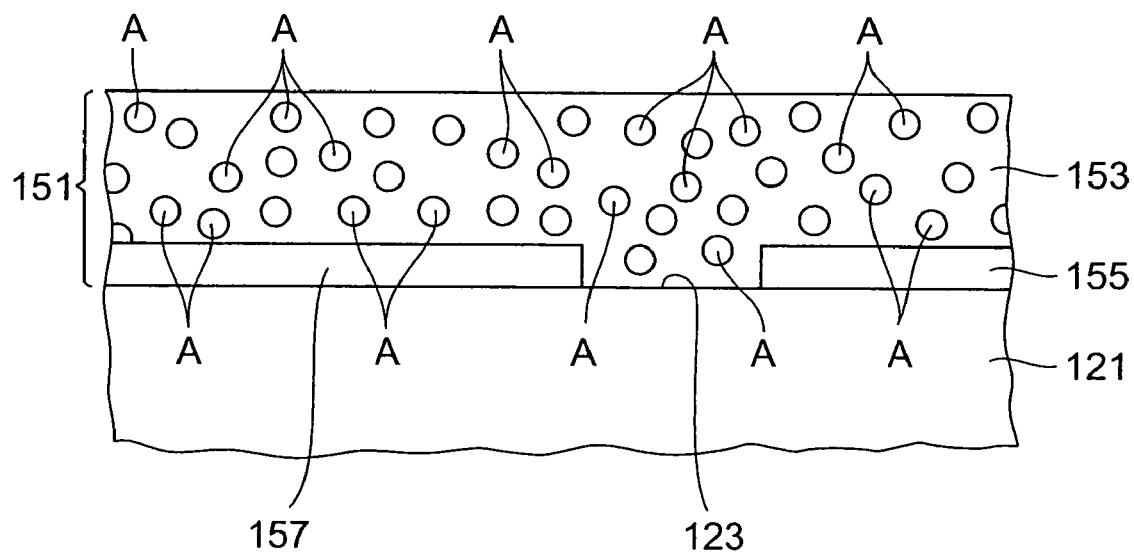
FIG. 15 is a schematic view showing a configuration of the reflecting portion in the light emitting apparatus of the third embodiment.

As also shown in FIG. 15, the reflecting portion 151 is formed on one principal surface 123 of the varistor element body 121. The reflecting portion 151 reflects the light traveling toward the multilayer chip varistor 111, out of the light generated by the semiconductor light emitting element 1. The reflecting portion 151 has a first reflecting layer 153, and second reflecting layers 155, 157.

The second reflecting layers 155, 157 are metal layers made of at least one metal selected from the group consisting of Ag, Al, Ti, and Ni, and specularly reflect incident light. In the present embodiment the second reflecting layers 155, 157 are metal layers made of Ag. The reason why Ag is selected is that it has an excellent reflection characteristic for light of wavelength near 460 nm. Since Al also has an excellent reflection characteristic for light of wavelength near 460 nm, Al may be used instead of Ag. The thickness of the second reflecting layers 155, 157 is, for example, approximately 0.1-10 μm.

Each second reflecting layer 155, 157 is formed on the one principal surface 123 so as to cover the one principal surface 123 of the varistor element body 121. The second reflecting layers 155, 157 are electrically isolated from each other on the one principal surface 123 and are located with a predetermined spacing in the direction perpendicular to the laminating direction of the varistor layers and parallel to the one principal surface 123.

The second reflecting layers 155, as also shown in FIG. 13, are of rectangular shape and are formed so as to be physically and electrically connected to the first electrode portions 142 or to the second electrode portions 143 of the second internal electrodes 141. This causes the fourth electrode portion 145 of each second internal electrode 141 to be electrically connected to a pair of second reflecting layers 155 through the first electrode portion 142 and the second electrode portion 143.

The second reflecting layer 157, as also shown in FIG. 13, is of rectangular shape and is formed so as to be physically and electrically connected to the first electrode portions 132 of the first internal electrodes 131. This causes the third electrode portion 134 of each first internal electrode 131 to be electrically connected through the first electrode portion 132 to the second reflecting layer 157.

Each of the second reflecting layers 155, 157 can be formed, for example, by printing or by plating. When the printing method is applied, the reflecting layers are formed by preparing an electroconductive paste in which an organic binder and an organic solvent are mixed in a metal powder consisting primarily of particles of the aforementioned metal (e.g., Ag particles or Al particles), printing the electroconductive paste on the varistor element body 121, and baking or firing it. When the plating method is applied, the second reflecting layers 155, 157 are formed by evaporating the aforementioned metal by a vacuum coating method (vacuum evaporation, sputtering, ion plating, or the like).

The first reflecting layer 153 is formed on the second reflecting layers 155, 157 so as to cover the second reflecting layers 155, 157. The first reflecting layer 153 is a glass layer in which an additive A is dispersed, and diffusely reflects incident light. The additive A can be, for example, a metal, a metal oxide, or a metal coated with a metal oxide. The additive A is dispersed in the form of fine powder in the glass layer. The glass components to make the glass layer can be $SiO_2$, $B_2O_3$, ZnO, $Al_2O_3$, BaO, SrO, CaO, $Bi_2O_3$, $K_2O$, $Li_2O$, and so on. The thickness of the first reflecting layer 153 is, for example, approximately 0.1-10 μm.

When a metal is used as the additive A, the metal is preferably at least one metal selected from the group consisting of Ag, Al, Ti, and Ni. When Ag or Al is used as the additive A among them, the first reflecting layer 153 comes to have an excellent reflection characteristic for light of wavelength near 460 nm.

When a metal oxide is used as the additive A, the metal oxide is preferably at least one selected from the group consisting of $Al_2O_3$, $TiO_2$, $SiO_2$, and $ZrO_2$. When $Al_2O_3$ is used as the additive A among them, the first reflecting layer 153 comes to have an excellent reflection characteristic for light of wavelength near 460 nm.

When a metal coated with a metal oxide is used as the additive A, it is preferably at least one metal selected from the group consisting of Ag, Al, Ti, and Ni, coated with at least one metal oxide selected from the group consisting of $Al_2O_3$, $TiO_2$, $SiO_2$, and $ZrO_2$. When Ag coated with $Al_2O_3$ or Al coated with $Al_2O_3$ is used among them, the first reflecting layer 153 comes to have an excellent reflection characteristic for light of wavelength near 460 nm.

In the present embodiment, the first reflecting layer 153 is a glass layer in which Ag is dispersed as the additive A. The glass layer in which Ag is dispersed is formed on the second reflecting layers 155, 157, for example, by printing. When the printing method is applied, the first reflecting layer 153 is formed by preparing a glass paste in which an organic binder and an organic solvent are mixed with glass powder and Ag powder, printing the glass paste on the second reflecting layers 155, 157 and the principal surface 123 of the varistor element body 121, drying it, and thereafter baking it.

Each of the second reflecting layers 155 is physically and electrically connected through conductors 161 provided so as to penetrate the first reflecting layer 153, to a plurality of pad electrodes 163 formed on the first reflecting layer 153. This causes the second internal electrodes 141 to be electrically connected through the second reflecting layers 155 and conductors 161 to the plurality of pad electrodes 163.

The second reflecting layer 157 is physically and mechanically connected through conductors 165 provided so as to penetrate the first reflecting layer 153, to a plurality of pad electrodes 167 formed on the first reflecting layer 153. This causes the first internal electrodes 131 to be electrically connected through the second reflecting layer 157 and conductors 165 to the plurality of pad electrodes 167.

Each of the pad electrodes 163, 167 can be formed, for example, by printing or by plating. When the printing method is applied, the pad electrodes are formed by preparing an electroconductive paste in which an organic binder and an organic solvent are mixed in a metal powder consisting primarily of Au particles or Pt particles, printing the electroconductive paste on the first reflecting layer 153, and baking or calcinating it. When the plating method is applied, the pad electrodes 163, 167 are formed by evaporating Au or Pt by a vacuum coating method (vacuum evaporation, sputtering, ion plating, or the like).

The conductors 161, 165 can be formed, for example, by a printing method. When the printing method is applied, the conductors are formed by preparing an electroconductive paste in which an organic binder and an organic solvent are mixed in a metal powder consisting primarily of gold, silver, or a silver compound, printing the electroconductive paste at desired positions on the second reflecting layers 155, 157, and baking or firing it.

Figure 16:
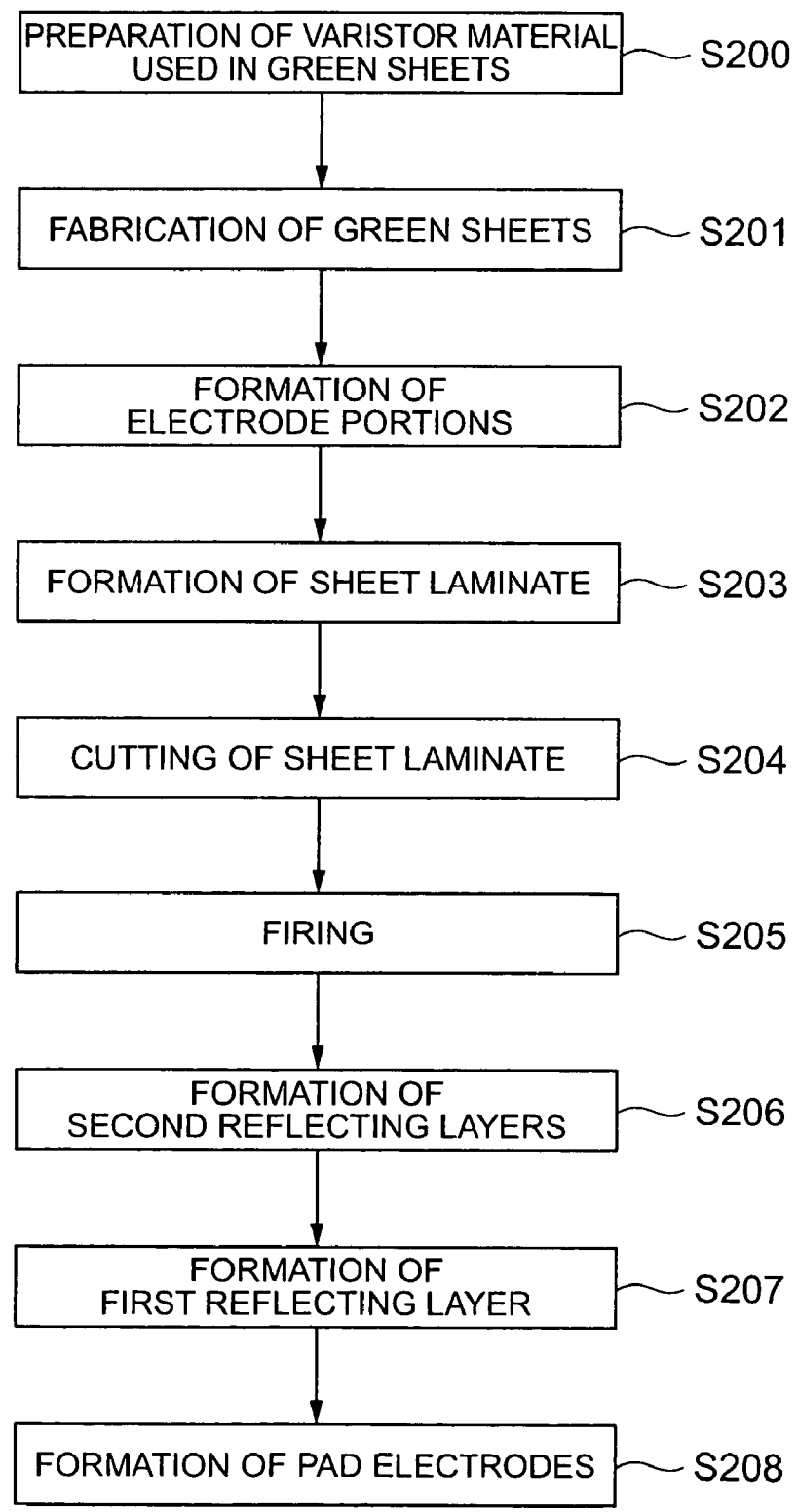
FIG. 16 is a flowchart for explaining a production process of the multilayer chip varistor and reflecting portion in the third embodiment.
Figure 17:
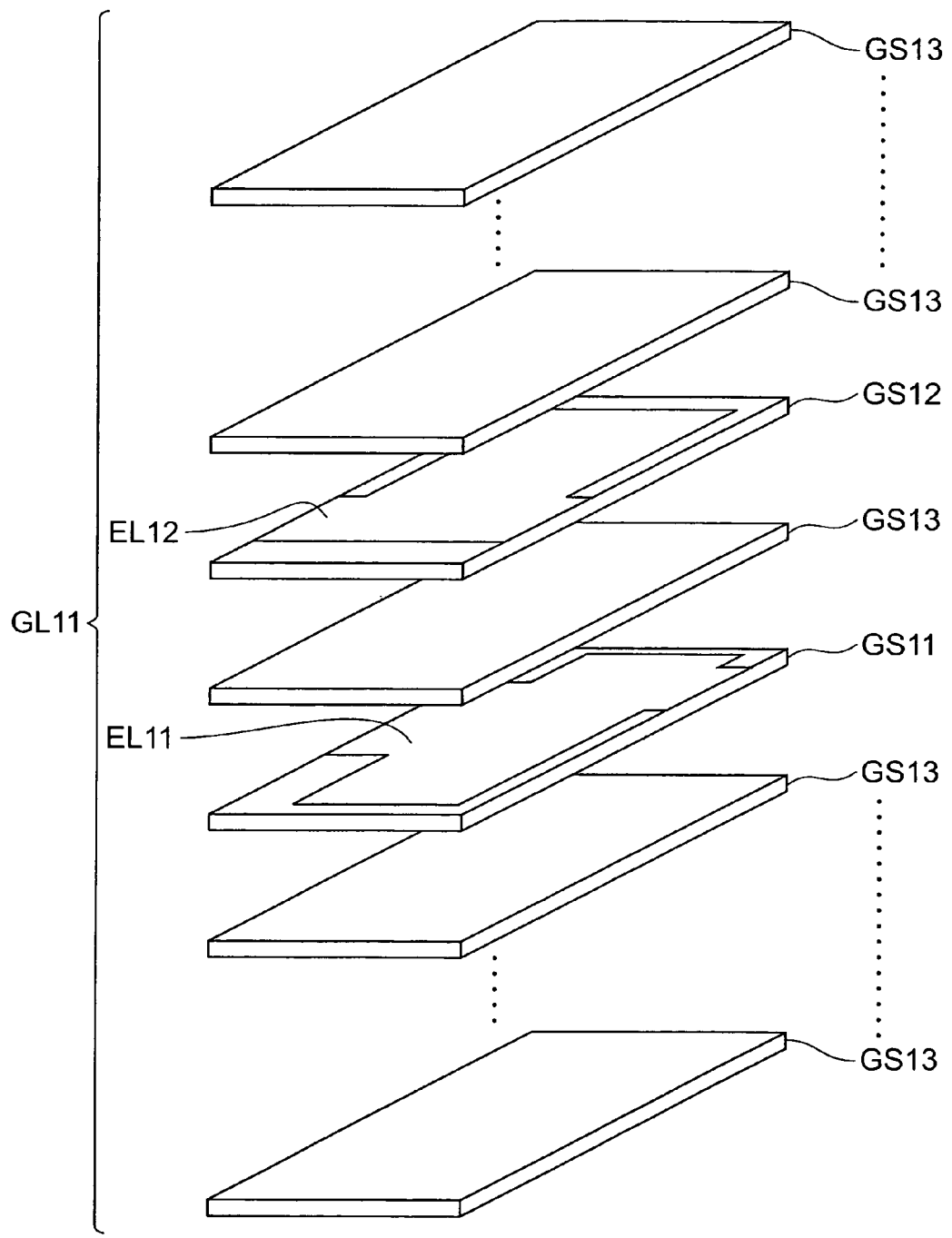
FIG. 17 is a drawing for explaining the production process of the multilayer chip varistor and reflecting portion in the third embodiment.

Subsequently, a production process of the multilayer chip varistor 111 and reflecting portion 151 having the above-described configuration will be described with reference to FIGS. 16 and 17. FIG. 16 is a flowchart for explaining the production process of the multilayer chip varistor and reflecting portion according to the present embodiment. FIG. 17 is a drawing for explaining the production process of the multilayer chip varistor and reflecting portion according to the present embodiment.

The first step is to weigh each of the principal component of ZnO and trace additives such as metals or oxides or the like of Pr, Co, Cr, Ca, Si, K, and Al constituting the varistor layers, at a predetermined ratio, and thereafter mix them to prepare a varistor material (step S200). Thereafter, an organic binder, an organic solvent, an organic plasticizer, etc. are added into this varistor material, and the mixture is mixed and pulverized for about 20 hours with a ball mill or the like to obtain a slurry.

This slurry is applied onto a film, for example, of polyethylene terephthalate by a well-known method such as the doctor blade method, and thereafter it is dried to form membranes in the thickness of about 30 μm. The membranes obtained in this manner are separated from the film to obtain green sheets (step S201).

The next step is to form a plurality of electrode portions (in the number corresponding to the number of divided chips described later) corresponding to the first and second internal electrodes 131, 141 on the green sheets (step S202). The electrode portions corresponding to the first and second internal electrodes 131, 141 are formed by printing an electroconductive paste in which a metal powder consisting primarily of Ag—Pd alloy particles, an organic binder, and an organic solvent are mixed, by a printing method such as screen printing, and drying it.

The next step is to laminate the green sheets with the electrode portions and green sheets without electrode portions in a predetermined sequence to form a sheet laminate (step S203). The sheet laminate obtained in this manner is cut in chip units to obtain a plurality of divided green bodies GL11 (cf. FIG. 17) (step S204). In each resultant green body GL11, the green sheets GS11 with the electrode portion EL11 corresponding to the first internal electrode 131, the green sheets GS12 with the electrode portion EL2 corresponding to the second internal electrode 141, and the green sheets GS13 without electrode portions EL11, EL12 are successively stacked. Each green sheet GS13 located between the green sheet GS11 and the green sheet GS12 may be comprised of a stack of plural sheets, or may be excluded.

Next, the green body GL11 is subjected to a thermal treatment at 180-400° C. and for about 0.5-24 hours to effect debindering and, thereafter, it is further fired at 850-1400° C. for about 0.5 to 8 hours (step S205), to obtain a varistor element body 121. This firing turns the green sheets GS11-GS13 in the green body GL11 into varistor layers. Each electrode portion EL11 turns into the first internal electrode 131. Each electrode portion EL12 turns into the second internal electrode 141.

The next step is to form the second reflecting layers 155, 157 on an outer surface of the varistor element body 121 (step S206). First, an electroconductive paste for the second reflecting layers 155, 157 is applied onto the outer surface of the varistor element body 121. In this step, the electroconductive paste is printed on the principal surface of the varistor element body 121 so as to contact the corresponding electrode portions EL11, EL12 by the screen printing method, thereby forming electrode portions corresponding to the second reflecting layers 155, 157. Thereafter, the varistor element body 121 with the electrode portions corresponding to the second reflecting layers 155, 157 is subjected to a thermal treatment (e.g., baking or firing or the like) at a desired temperature (500-850° C.). This results in forming the second reflecting layers 155, 157 on the outer surface of the varistor element body 121. The electroconductive paste for the second reflecting layers 155, 157 can be a paste in which an organic binder and an organic solvent are mixed in a metal powder consisting primarily of particles of silver or a silver compound.

The next step is to form the first reflecting layer 153 on the second reflecting layers 155, 157 (step S207). First, a glass paste for the first reflecting layer 153 is applied onto the second reflecting layers 155, 157. In this step, a glass paste in which an Ag powder, a glass powder, an organic binder, and an organic solvent are mixed, is printed and applied by a printing method such as screen printing. After the glass paste is printed and applied, it is dried to form a layer corresponding to the first reflecting layer 153. At this time, apertures are formed at positions corresponding to the conductors 161, 165, to expose the second reflecting layers 155, 157. Then an electroconductive paste for the conductors 161, 165 is applied to the positions of the apertures. Thereafter, the varistor element body 121 coated with the glass paste and the electroconductive paste is subjected to a thermal treatment (e.g., baking or firing or the like) at a desired temperature (500-850° C.). This results in forming the first reflecting layer 153 and conductors 161, 165 on the second reflecting layers 155, 157. The electroconductive paste for the conductors 161, 165 can be a paste in which an organic binder and an organic solvent are mixed in a metal powder consisting primarily of particles of silver or a silver compound.

After the varistor element body 121 and reflecting portion 151 are formed as described above, a plurality of pad electrodes 163, 167 are formed on the conductors 161, 165 (step S208). In this step, a vacuum coating method is used to evaporate Au on the conductors 161, 165 and the first reflecting layer 153 to form the plurality of pad electrodes 163, 167. The above process results in obtaining the multilayer chip varistor 111 in which the reflecting portion 151 is formed.

Reference is made again to FIG. 12. In the semiconductor light emitting element 1, when a predetermined voltage is applied between the anode electrode 7 (bump electrode 8) and the cathode electrode 6 (bump electrode 8) to flow an electric current, light is generated in the luminous region of the light-emitting layer 4. The light generated in the luminous region is radiated to the exterior of the semiconductor light emitting element 1. Part of the light radiated to the exterior of the semiconductor light emitting element 1 is reflected by the reflecting portion 151.

The semiconductor light emitting element 1 is flip-chip bonded to the plurality of pad electrodes 163, 167. Namely, the cathode electrode 6 is electrically and physically connected through the bump electrodes 8 to the plurality of pad electrodes 163. The anode electrode 7 is electrically and physically connected through the bump electrodes 8 to the plurality of pad electrodes 167. This causes the varistor portion comprised of the third electrode portions 134, the fourth electrode portions 145, and the regions in the varistor layers overlapping with the third electrode portions 134 and the fourth electrode portions 145 to be connected in parallel to the semiconductor light emitting element 1.

In the present embodiment, as described above, the reflecting portion 151 is located between the multilayer chip varistor 111 and the semiconductor light emitting element 1, whereby the reflecting portion 151 reflects the light traveling toward the multilayer chip varistor 111 out of the light generated by the semiconductor light emitting element 1. At this time, since the reflecting portion 151 has the first reflecting layer 153 and the second reflecting layers 155, 157, the light traveling from the semiconductor light emitting element 1 toward the multilayer chip varistor 111 is first incident to the first reflecting layer 153 to be diffusely reflected. Then the light transmitted by the first reflecting layer 153 is specularly reflected by the second reflecting layers 155, 157. In consequence of these, the reflecting portion 151 reflects the incident light to produce reflected light consisting of the light diffusely reflected by the first reflecting layer 153 and the light specularly reflected by the second reflecting layers 155, 157. Therefore, since the reflecting portion 151 has the first reflecting layer 153 and the second reflecting layers 155, 157, the light emitting apparatus LE3 can achieve an extremely high luminous efficiency. In the light emitting apparatus LE3 an in-plane distribution of intensities of the reflected light is also approximately uniform.

In the present embodiment, since the reflecting portion 151 is located between the multilayer chip varistor 111 and the semiconductor light emitting element 1, there is no need for securing an extra space around the semiconductor light emitting element 1. Therefore, the light emitting apparatus LE3 can be downsized.

In the present embodiment the first reflecting layer 153 is a glass layer in which a metal is dispersed. In this configuration the first reflecting layer 153 comes to have electric insulation and a short circuit can be prevented from occurring in the multilayer chip varistor 111. It is also feasible to suppress occurrence of a short circuit between the second reflecting layers 155 and the second reflecting layer 157.

In the present embodiment, since the first reflecting layer 153 is the glass layer, the first reflecting layer 153 has excellent heat resistance. Since the metal is dispersed in the glass layer, the glass layer can diffusely reflect the incident light with certainty. Since the metal is dispersed in the glass layer, the first reflecting layer 153 has a relatively high thermal conductivity and is able to efficiently dissipate heat from the semiconductor light emitting element 1.

When the first reflecting layer 153 is a glass layer in which a metal oxide is dispersed, the first reflecting layer 153 also has electric insulation and is able to suppress occurrence of a short circuit in the multilayer chip varistor 111. In addition, the first reflecting layer 153 can have excellent heat resistance. Since the metal oxide is dispersed in the glass layer, the glass layer can diffusely reflect incident light with certainty and the electric insulation of the first reflecting layer 153 can be further enhanced. Since the metal oxide has good dispersibility in glass, the metal oxide is uniformly dispersed and the first reflecting layer 153 has little characteristic variation. When the first reflecting layer 153 contains the glass and metal oxide, it has the coefficient of thermal expansion relatively small. For this reason, the first reflecting layer 153 can be prevented from being distorted or broken or from cracking.

When the first reflecting layer 153 is a glass layer in which a metal coated with a metal oxide is dispersed, the first reflecting layer 153 also has electric insulation and is able to suppress occurrence of a short circuit in the multilayer chip varistor 111. In addition, the first reflecting layer 153 comes to have excellent heat resistance. Since the metal is coated with the metal oxide, the dispersibility of the metal can be enhanced in the glass and the electric insulation of the first reflecting layer 153 can be further enhanced without reduction in the reflection efficiency.

In the present embodiment, the metal dispersed in the glass layer is at least one metal selected from the group consisting of Ag, Al, Ti, and Ni. Since Ag, Al, Ti, and Ni have the reflectance higher than those of the other common metals, they can increase the reflection efficiency of the first reflecting layer 153. Therefore, the luminous efficiency of the light emitting apparatus LE3 can be further increased.

When the metal oxide is dispersed in the glass layer or when the metal is coated with the metal oxide, the metal oxide is preferably at least one metal oxide selected from the group consisting of $Al_2O_3$, $TiO_2$, $SiO_2$, and $ZrO_2$. Since $Al_2O_3$, $TiO_2$, $SiO_2$, and $ZrO_2$ have the reflectance higher than those of the other common metal oxides, they can further enhance the reflection efficiency of the first reflecting layer 153.

In the present embodiment the second reflecting layers 155, 157 are metal layers. This permits the second reflecting layers to securely specularly reflect the light transmitted by the first reflecting layer 153. The metal layers forming the second reflecting layers 155, 157 are made of at least one metal selected from the group consisting of Ag, Al, Ti, and Ni. Since Ag, Al, Ti, and Ni have the reflectance higher than those of the other common metals, they can increase the reflection efficiency of the second reflecting layers 155, 157. Therefore, the luminous efficiency of the light emitting apparatus LE3 can be further enhanced.

Incidentally, in the varistor element body 121 the thermal conductivity in the direction perpendicular to the opposing direction of the first and second internal electrodes 131, 141 is larger than the thermal conductivity in the opposing direction. This presumably results from the fact that each of the internal electrodes 131, 141 extends in the direction perpendicular to the opposing direction of the first and second internal electrodes 131, 141, and heat is likely to transmit in the direction parallel to the first and second internal electrodes 131, 141. The outer surfaces extending in parallel to the opposing direction of the first and second internal electrodes 131, 141 (e.g., principal surfaces 123, 125) out of the outer surfaces of the varistor element body 121 dissipate more heat than the outer surfaces extending in the direction intersecting with the opposing direction of the first and second internal electrodes 131, 141 out of the outer surfaces of the varistor element body 121.

In the present embodiment, the second reflecting layers 155, 157 are formed on one principal surface 123 of the varistor element body 121, and the first reflecting layer 153 is formed on the second reflecting layers 155, 157 so as to cover the second reflecting layers 155, 157. This makes the reflecting portion 151 also thermally coupled to one principal surface 123 of the varistor element body 121, and the heat generated in the semiconductor light emitting element 1 is efficiently transferred from one principal surface 123 of the varistor element body 121 to the varistor element body 121 through the reflecting portion 151. The heat transferred to the varistor element body 121 is dissipated mainly from the outer surface (e.g., principal surface 125) extending in parallel to the opposing direction of the first and second internal electrodes 131, 141 out of the outer surfaces of the varistor element body 121. This results in suppressing characteristic degradation of the semiconductor light emitting element 1 and the luminous efficiency of the light emitting apparatus LE3 can be further enhanced thereby.

In the present embodiment, the second reflecting layers 155, 157 are comprised of a plurality of metal layers electrically isolated from each other, the plurality of metal layers are connected each to corresponding internal electrodes 131, 141 out of the first and second internal electrodes 131, 141, and the metal layers are connected each to the plurality of pad electrodes 163, 167 formed on the first reflecting layer 153 through the conductors 161, 165 provided so as to penetrate the first reflecting layer 153. In this case, the second reflecting layers 155, 157 form part of electric current paths between the multilayer chip varistor 111 and the semiconductor light emitting element 1. As a result, secure electric connection between the multilayer chip varistor 111 and the semiconductor light emitting element 1 can be implemented by the extremely simple configuration even if the reflecting portion 151 is located between the multilayer chip varistor 111 and the semiconductor light emitting element 1.

In the multilayer chip varistor 111 and the semiconductor light emitting element 1, physical connections are made among the bump electrodes 8, the plurality of pad electrodes 163, 167, the conductors 161, 165, the second reflecting layers 155, 157, and the first and second internal electrodes 131, 141. In this configuration, the heat generated in the semiconductor light emitting element 1 is transferred mainly through the bump electrodes 8, the plurality of pad electrodes 163, 167, the conductors 161, 165, the second reflecting layers 155, 157, and the first and second internal electrodes 131, 141 to the multilayer chip varistor 111. As a result, heat radiation paths are expanded for the heat generated in the semiconductor light emitting element 1, so that the heat generated in the semiconductor light emitting element 1 can be efficiently dissipated.

In the present embodiment the varistor layers consist primarily of ZnO. ZnO has the thermal conductivity equivalent to that of alumina or the like usually used as a heat radiating substrate, and thus has the relatively good thermal conductivity. Therefore, it is feasible to prevent the varistor layers from impeding dissipation of heat from the first and second internal electrodes 131, 141.

In the present embodiment the semiconductor light emitting element 1 is connected in parallel to the multilayer chip varistor 111, whereby the semiconductor light emitting element 1 can be protected from an ESD surge.

The above described the preferred embodiments of the present invention, but it is noted that the present invention is by no means limited to the above-described embodiments and can be modified in various ways without departing from the spirit and scope of the invention.

The GaN semiconductor LED was used as the semiconductor light emitting element 1, 60, but the light emitter does not have to be limited to this. The semiconductor light emitting element 1, 60 may be, for example, a nitride semiconductor LED except for the GaN semiconductor LED (e.g., an InGaNAs semiconductor LED or the like), a compound semiconductor LED except for the nitride type, or a laser diode (LD). The configuration of the multilayer chip varistor 11, 70, or 111 is not limited to those in the embodiments, either.

In the first to third embodiments the varistor element body 21, 121 includes the first internal electrodes 31, 131 and the second internal electrodes 41, 141 two or more each, but they are not limited to this. For example, the varistor element body 21, 121 may include one first internal electrode 31, 131 and one second internal electrode 41, 141.

In the third embodiment the second reflecting layers 155, 157 form part of the electric current paths between the multilayer chip varistor 111 and the semiconductor light emitting element 1, but the configuration is not limited to this. For example, instead of the configuration wherein the second reflecting layers 155, 157 form part of the electric current paths between the multilayer chip varistor 111 and the semiconductor light emitting element 1, the multilayer chip varistor 111 and the semiconductor light emitting element 1 may be electrically isolated from each other. In this case, it is necessary to adopt the following configuration: a connection conductor for electrically connecting the first internal electrodes 131 to each other, and a connection conductor for electrically connecting the second internal electrodes 141 to each other are formed each on the principal surface 123 of the varistor element body 121, and each of the connection conductors is electrically connected to the corresponding pad electrodes 163, 167. Electric insulation between the second reflecting layers 155, 157 and each connection conductor can be implemented by forming an insulating layer (e.g., a glass layer or the like) between the second reflecting layers 155, 157 and the connection conductors. The second reflecting layers 155, 157 may be formed on the principal surface 123 of the varistor element body 121 so as to be electrically isolated from the connection conductors. The connection conductors may form part of the electric current paths between the multilayer chip varistor 111 and the semiconductor light emitting element 1.

In the third embodiment the semiconductor light emitting element 1 is electrically connected to the multilayer chip varistor 111 as mounted on the multilayer chip varistor 111 by flip chip bonding, but the configuration is not limited to this. For example, the semiconductor light emitting element 1 may be electrically connected to the multilayer chip varistor 111 by wire bonding, for example, by fixing the semiconductor light emitting element 1 onto the multilayer chip varistor 111 with a gold-tin alloy (Au—Sn) solder or with an adhesive.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A light emitting apparatus comprising:
a multilayer chip varistor having a varistor element body comprising a varistor layer and a plurality of internal electrodes opposed to each other so as to interpose the varistor layer between the internal electrodes;
a semiconductor light emitting element disposed on the multilayer chip varistor and electrically connected to the plurality of internal electrodes so as to be connected in parallel to the multilayer chip varistor; and
a reflecting portion disposed between a surface of the multilayer chip varistor opposing the semiconductor light emitting element and a surface of the semiconductor light emitting element opposing the multilayer chip varistor and adapted to reflect light generated by the semiconductor light emitting element;
wherein the reflecting portion has:
a first reflecting layer for diffusely reflecting incident light, and
a second reflecting layer disposed between the first reflecting layer and the multilayer chip varistor and adapted to specularly reflect incident light,
wherein the first reflecting layer is a glass layer in which a metal is dispersed, and
wherein the second reflecting layer is formed directly on the multilayer chip varistor.

2. The light emitting apparatus according to claim 1, wherein the second reflecting layer is a metal layer.

3. The light emitting apparatus according to claim 1, wherein the second reflecting layer is formed on one outer surface of the varistor element body extending in a direction parallel to an opposing direction of the plurality of internal electrodes, and
wherein the first reflecting layer is formed on the second reflecting layer so as to cover the second reflecting layer.

4. The light emitting apparatus according to claim 3, wherein the second reflecting layer consists of a plurality of metal layers electrically insulated from each other, and
wherein the plurality of metal layers are connected each to corresponding internal electrodes out of the plurality of internal electrodes and connected each to a plurality of pad electrodes formed on the first reflecting layer through conductors provided so as to penetrate the first reflecting layer.

5. The light emitting apparatus according to claim 4, wherein the semiconductor light emitting element is connected to the plurality of pad electrodes.

6. A light emitting apparatus comprising:
a multilayer chip varistor having a varistor element body comprising a varistor layer and a plurality of internal electrodes opposed to each other so as to interpose the varistor layer between the internal electrodes;
a semiconductor light emitting element disposed on the multilayer chip varistor and electrically connected to the plurality of internal electrodes so as to be connected in parallel to the multilayer chip varistor; and a reflecting portion disposed between a surface of the multilayer chip varistor opposing the semiconductor light emitting element and a surface of the semiconductor light emitting element opposing the multilayer chip varistor and adapted to reflect light generated by the semiconductor light emitting element;

wherein the reflecting portion has:
- a first reflecting layer for diffusely reflecting incident light, and
- a second reflecting layer disposed between the first reflecting layer and the multi layer chip varistor and adapted to specularly reflect incident light,
- wherein the first reflecting layer is a glass layer in which a metal oxide is dispersed, and
- wherein the second reflecting layer is formed directly on the multilayer chip varistor.

7. The light emitting apparatus according to claim 6, wherein the second reflecting layer is a metal layer.

8. The light emitting apparatus according to claim 6, wherein the second reflecting layer is formed on one outer surface of the varistor element body extending in a direction parallel to an opposing direction of the plurality of internal electrodes, and
wherein the first reflecting layer is formed on the second reflecting layer so as to cover the second reflecting layer.

9. The light emitting apparatus according to claim 7, wherein the second reflecting layer consists of a plurality of metal layers electrically insulated from each other, and
wherein the plurality of metal layers are connected each to corresponding internal electrodes out of the plurality of internal electrodes and connected each to a plurality of pad electrodes formed on the first reflecting layer through conductors provided so as to penetrate the first reflecting layer.

10. The light emitting apparatus according to claim 9, wherein the semiconductor light emitting element is connected to the plurality of pad electrodes.

11. A light emitting apparatus comprising:
a multilayer chip varistor having a varistor element body comprising a varistor layer and a plurality of internal electrodes opposed to each other so as to interpose the varistor layer between the internal electrodes;

a semiconductor light emitting element disposed on the multilayer chip varistor and electrically connected to the plurality of internal electrodes so as to be connected in parallel to the multilayer chip varistor; and a reflecting portion disposed between a surface of the multilayer chip varistor opposing the semiconductor light emitting element and a surface of the semiconductor light emitting element opposing the multilayer chip varistor and adapted to reflect light generated by the semiconductor light emitting element;

wherein the reflecting portion has:
- a first reflecting layer for diffusely reflecting incident light, and
- a second reflecting layer disposed between the first reflecting layer and the multilayer chip varistor and adapted to specularly reflect incident light,
- wherein the first reflecting layer is a glass layer in which a metal coated with a metal oxide is dispersed, and
- wherein the second reflecting layer is formed directly on the multilayer chip varistor.

12. The light emitting apparatus according to claim 11, wherein the second reflecting layer is a metal layer.

13. The light emitting apparatus according to claim 11, wherein the second reflecting layer is formed on one outer surface of the varistor element body extending in a direction parallel to an opposing direction of the plurality of internal electrodes, and
wherein the first reflecting layer is formed on the second reflecting layer so as to cover the second reflecting layer.

14. The light emitting apparatus according to claim 13, wherein the second reflecting layer consists of a plurality of metal layers electrically insulated from each other, and
wherein the plurality of metal layers are connected each to corresponding internal electrodes out of the plurality of internal electrodes and connected each to a plurality of pad electrodes formed on the first reflecting layer through conductors provided so as to penetrate the first reflecting layer.

15. The light emitting apparatus according to claim 14, wherein the semiconductor light emitting element is connected to the plurality of pad electrodes.

* * * * *